(12) United States Patent
Jang et al.

(10) Patent No.: US 12,473,632 B2
(45) Date of Patent: Nov. 18, 2025

(54) MASK ASSEMBLY AND METHOD OF MANUFACTURING DISPLAY APPARATUS

(71) Applicant: Samsung Display Co., Ltd., Yongin-si (KR)

(72) Inventors: Wonyoung Jang, Yongin-si (KR); Jongdae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 18/094,057

(22) Filed: Jan. 6, 2023

(65) Prior Publication Data

US 2023/0304145 A1    Sep. 28, 2023

(30) Foreign Application Priority Data

Mar. 22, 2022    (KR) .................. 10-2022-0035534

(51) Int. Cl.
*C23C 16/04*     (2006.01)
(52) U.S. Cl.
CPC .................. *C23C 16/042* (2013.01)
(58) Field of Classification Search
USPC ......................................... 118/721, 504, 505
See application file for complete search history.

(56) References Cited

U.S. PATENT DOCUMENTS

| | | | |
|---|---|---|---|
| 7,618,674 B2 | 11/2009 | Kang et al. | |
| 8,151,729 B2 * | 4/2012 | Ko | B23K 31/02 118/301 |
| 9,932,662 B2 | 4/2018 | Lee | |
| 10,337,097 B2 | 7/2019 | Ji et al. | |
| 2012/0234236 A1 * | 9/2012 | Ko | H10K 50/8426 118/504 |
| 2014/0326780 A1 | 11/2014 | Han | |
| 2015/0068456 A1 * | 3/2015 | Kuriyama | B23Q 1/03 29/559 |

FOREIGN PATENT DOCUMENTS

| | | |
|---|---|---|
| CN | 105586568 A | 5/2016 |
| KR | 1996-0005696 A | 2/1996 |
| KR | 10-0696472 B1 | 3/2007 |
| KR | 20140018727 A * | 2/2014 |
| KR | 10-2014-0131429 A | 11/2014 |
| KR | 10-2015-0002614 A | 1/2015 |
| KR | 10-2016-0107405 A | 9/2016 |

OTHER PUBLICATIONS

English Translation KR-20140018727-A (Year: 2014).*

* cited by examiner

*Primary Examiner* — Yewebdar T Tadesse
(74) *Attorney, Agent, or Firm* — Womble Bond Dickinson (US) LLP

(57) ABSTRACT

A mask assembly includes: a mask frame having a plurality of sides including a first side extending in a first direction, and an opening area defined by the plurality of sides; a gap portion recessed in the first side in a second direction crossing the first direction; a mask sheet covering the opening area; and a gap adjustment portion tensile-welded to the mask frame across the gap portion.

7 Claims, 16 Drawing Sheets

MASK ASSEMBLY AND METHOD OF MANUFACTURING DISPLAY APPARATUS

CROSS-REFERENCE TO RELATED APPLICATION

This application claims priority to and the benefit of Korean Patent Application No. 10-2022-0035534, filed on Mar. 22, 2022, in the Korean Intellectual Property Office, the entire disclosure of which is incorporated by reference herein.

BACKGROUND

1. Field

Aspects of one or more embodiments of the present disclosure relate to a mask assembly and a method of manufacturing a display apparatus, and more particularly, to a mask assembly that may improve deposition quality of a deposition material, and a method of manufacturing a display apparatus.

2. Description of the Related Art

Electronic apparatuses have been widely used. Electronic apparatuses have been variously used in mobile electronic apparatuses and stationary electronic apparatuses. The electronic apparatuses include display apparatuses that provide users with visual information, such as images and/or videos, to support various suitable functions.

A display apparatus that visually displays data is formed by depositing various suitable layers, such as an organic layer, a metal layer, and the like. A deposition material may be deposited to form a plurality of layers of the display apparatus. In other words, the deposition material is ejected from a deposition source, and deposited on a substrate through a mask assembly. In this state, when deformation occurs in a mask sheet and/or a mask frame to which the mask sheet is welded, the deposition material may not be deposited at a desired position on the substrate, and thus, deposition quality may be degraded.

The above information disclosed in this Background section is for enhancement of understanding of the background of the present disclosure, and therefore, it may contain information that does not constitute prior art.

SUMMARY

One or more embodiments of the present disclosure are directed to a mask assembly that may improve a deposition quality by including a side of a mask frame that may have an adjustable length when a mask sheet and/or the mask frame deforms, and a method of manufacturing a display apparatus.

However, the aspects and features of the present disclosure are not limited to those described above.

Additional aspects and features will be set forth, in part, in the description that follows, and in part, will be apparent from the description, or may be learned by practicing one or more of the presented embodiments of the present disclosure.

According to one or more embodiments of the present disclosure, a mask assembly includes: a mask frame having a plurality of sides including a first side extending in a first direction, and an opening area defined by the plurality of sides; a gap portion recessed in the first side in a second direction crossing the first direction; a mask sheet covering the opening area; and a gap adjustment portion tensile-welded to the mask frame across the gap portion.

In an embodiment, the gap portion may include: a first portion recessed in the second direction in a plan view; and a second portion at one end portion of the first portion, and recessed in the second direction, a width of at least part of the second portion being greater than a width of the first portion.

In an embodiment, the second portion may have a circular shape in a plan view.

In an embodiment, the width of the first portion in the first direction may be less than a length of the first portion in the second direction.

In an embodiment, the width of the first portion in the first direction may gradually decrease along the second direction.

In an embodiment, the mask sheet may include a first mask sheet and a second mask sheet parallel to each other in the first direction, and the gap portion may be spaced from the first mask sheet and the second mask sheet in the second direction, and may be located between the first mask sheet and the second mask sheet in the first direction.

In an embodiment, the mask sheet may include a first mask sheet and a second mask sheet parallel to each other in the first direction, and the gap portion may be spaced from the first mask sheet and the second mask sheet in the second direction, and may overlap with each of a width of the first mask sheet extending in the first direction and a width of the second mask sheet extending in the first direction in the second direction.

According to one or more embodiments of the present disclosure, a method of manufacturing a display apparatus, includes: preparing a mask assembly including a mask frame having a first side extending in a first direction, and a first gap portion recessed in the first side in a second direction crossing the first direction; disposing one or more mask sheets on the mask frame; examining an alignment of the one or more mask sheets disposed on the mask frame; and adjusting a length of the mask frame by tensile-welding a gap adjustment portion to the first side across the first gap portion.

In an embodiment, the disposing of the one or more mask sheets may include welding and fixing the one or more mask sheets to the mask frame.

In an embodiment, the mask frame may further have a second side extending in the second direction crossing the first direction, and a second gap portion in the second side, and the method may further include adjusting a length of the second side of the mask frame by tensile-welding a gap adjustment portion to the second side across the second gap portion.

In an embodiment, the first gap portion may include a plurality of first gap portions, and the adjusting of the length of the first side of the mask frame may include selectively tensile-welding a gap adjustment portion to some of the plurality of first gap portions.

In an embodiment, the one or more mask sheets may include a first mask sheet and a second mask sheet parallel to each other in the first direction, and the first gap portion may be spaced from the first mask sheet and the second mask sheet in the second direction, and may be located between the first mask sheet and the second mask sheet in the first direction.

In an embodiment, the one or more mask sheets may include a first mask sheet and a second mask sheet parallel to each other in the first direction, and the first gap portion may be spaced from the first mask sheet and the second mask sheet in the second direction, and may be located to overlap with each of a width of the first mask sheet extending in the first direction and a width of the second mask sheet extending in the first direction in the second direction.

According to one or more embodiments of the present disclosure, a method of manufacturing a display apparatus, includes: preparing a mask assembly including a mask frame having a first side extending in a first direction, and a first gap portion recessed in the first side in a second direction crossing the first direction; tensile-welding a first gap adjustment portion to the first side across the first gap portion; disposing one or more mask sheets on the mask frame; examining an alignment of the one or more mask sheets disposed on the mask frame; and removing the first gap adjustment portion to extend a length of the first side, or tensile-welding a second gap adjustment portion to the first side across the first gap portion adjacent to the first gap adjustment portion to contract the length of the first side.

In an embodiment, the disposing of the one or more mask sheets may include welding and fixing the one or more mask sheets to the mask frame.

In an embodiment, the mask frame may further have a second side extending in the second direction crossing the first direction, and a second gap portion in the second side, and the method may further include tensile-welding a first gap adjustment portion to the second side across the second gap portion.

In an embodiment, the method may further include removing the first gap adjustment portion from across the second gap portion to extend a length of the second side, or tensile-welding a second gap adjustment portion to the second side across the second gap portion adjacent to the first gap adjustment portion across the second gap portion to contract the length of the second side.

In an embodiment, the one or more mask sheets may include a first mask sheet and a second mask sheet parallel to each other in the first direction, and the first gap portion may be spaced from the first mask sheet and the second mask sheet in the second direction, and may be located between the first mask sheet and the second mask sheet in the first direction.

In an embodiment, the one or more mask sheets may include a first mask sheet and a second mask sheet parallel to each other in the first direction, and the first gap portion may be spaced from the first mask sheet and the second mask sheet in the second direction, and may overlap with each of a width of the first mask sheet extending in the first direction and a width of the second mask sheet extending in the first direction in the second direction.

In an embodiment, the second gap adjustment portion may be spaced from the first gap adjustment portion in the second direction, and may be located parallel to the first gap adjustment portion.

The above and other aspects and features of the present disclosure will become more apparent from the following drawings, the detailed description, and the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
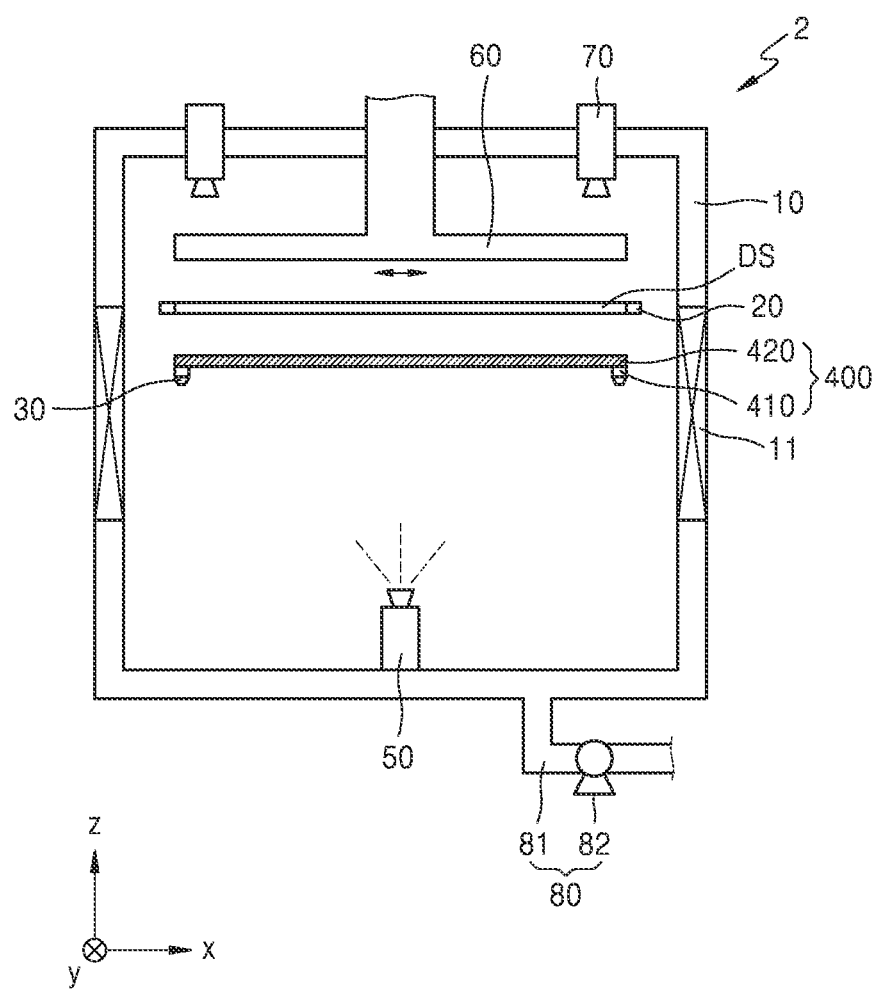
FIG. 1 is a cross-sectional view of an apparatus for manufacturing a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, region, or component is referred to as being "formed on" another layer, region, or component, it can be directly or indirectly formed on the other layer, region, or component. That is, for example, one or more intervening layers, regions, or components may be present. When a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a cross-sectional view of an apparatus 2 for manufacturing a display apparatus according to an embodiment.

The apparatus 2 for manufacturing a display apparatus may include a chamber 10, a first support portion 20, a second support portion 30, a mask assembly 400, a deposition source 50, a magnetic force portion 60, a vision portion 70, and a pressure control portion 80. For convenience of illustration, the first support portion 20, the mask assembly 400, and the magnetic force portion 60 may be shown in an exploded state in FIG. 1.

The chamber 10 may have a space formed therein, in which a display substrate DS and the mask assembly 400 may be accommodated. In this state, a portion of the chamber 10 may be formed to be open, and a gate valve 11 may be provided in an open portion of the chamber 10. In this case, the open portion of the chamber 10 may be open and/or closed depending on the operation of the gate valve 11.

The display substrate DS may refer to a display substrate DS in a process of manufacturing a display apparatus, in which at least one of an organic layer, an inorganic layer, or a metal layer is deposited on a substrate 100, which will be described in more detail below. As another example, the display substrate DS may be the substrate 100 on which none of the organic layer, the inorganic layer, and the metal layer are deposited.

The first support portion 20 may support the display substrate DS. The first support portion 20 may have a shape of a plate that is fixed in the chamber 10. In another embodiment, the first support portion 20 may be where the display substrate DS is placed, and may be provided in a form of a shuttle capable of linear motion inside the chamber 10. In another embodiment, the first support portion 20 may include an electrostatic chuck or an adhesive chuck that is fixed to the chamber 10 or disposed in the chamber 10 to be movable in the chamber 10.

The second support portion 30 may support the mask assembly 400. The second support portion 30 may be disposed in the chamber 10. The second support portion 30 may be capable of fine adjustments of the position of the mask assembly 400. The second support portion 30 may include a separate driving portion, an alignment unit (e.g., an aligner), and the like, to move the mask assembly 400 in different directions.

In another embodiment, the second support portion 30 may be provided in a form of a shuttle. In this case, the second support portion 30 may transfer the mask assembly 400 that is placed thereon. For example, the second support portion 30 may move to the outside of the chamber 10, and may enter the chamber 10 from the outside after the mask assembly 400 is placed thereon.

In the above case, the first support portion 20 and the second support portion 30 may be integrally formed. In this case, the first support portion 20 and the second support portion 30 may each include a movable shuttle. The first support portion 20 and the second support portion 30 may include suitable structures to fix the mask assembly 400 and the display substrate DS placed on the mask assembly 400, and may be capable of linearly moving the display substrate DS and the mask assembly 400 concurrently (e.g., at the same or substantially at the same time) with each other.

However, for convenience, hereinafter, a case in which the first support portion 20 and the second support portion 30 are separately formed at different positions in the chamber 10 is mainly described in more detail.

The deposition source 50 may be disposed to face the mask assembly 400. The deposition source 50 may include a deposition material, and by applying heat to the deposition material, the deposition material may evaporate or sublimate. The deposition source 50 may be disposed to be fixed in the chamber 10, or to be capable of linear motion in one direction in the chamber 10.

The mask assembly 400 may be disposed in the chamber 10. The mask assembly 400 may include a mask frame 410, a mask sheet 420, a gap portion 430 (e.g., see FIG. 2), and a gap adjustment portion 440, which are described in more detail below. The deposition material may be deposited on the display substrate DS by passing through the mask assembly 400.

The magnetic force portion 60 may be disposed in the chamber 10 to face the display substrate DS and/or the mask assembly 400. The magnetic force portion 60 may apply a magnetic force to the mask assembly 400 to apply a force to the mask assembly 400 toward the display substrate DS. In more detail, the magnetic force portion 60 may prevent or substantially prevent sagging of the mask sheet 420, and may also make the mask sheet 420 to be adjacent to the display substrate DS. Furthermore, the magnetic force portion 60 may maintain or substantially maintain a constant interval between the mask sheet 420 and the display substrate DS.

The vision portion 70 is disposed in the chamber 10, and may capture the positions of the display substrate DS and the mask assembly 400. The vision portion 70 may include a camera for capturing images of the display substrate DS and the mask assembly 400. The positions of the display substrate DS and the mask assembly 400 may be identified based on the images captured by the vision portion 70, and thus, deformation of the mask assembly 400 may be checked. Furthermore, based on the images, the first support portion 20 may finely adjust the position of the display substrate DS, and/or the second support portion 30 may finely adjust the position of the mask assembly 400. However, for convenience, a case in which the positions of the display substrate DS and the mask assembly 400 are aligned with each other by finely adjusting the position of the mask assembly 400 by using the second support portion is mainly described in more detail hereinafter.

The pressure control portion 80 is connected to the chamber 10, and may control a pressure in the chamber 10. For example, the pressure control portion 80 may control the pressure in the chamber 10 to be the same or substantially the same as (or similar to) an atmospheric pressure. Furthermore, the pressure control portion 80 may control the pressure in the chamber 10 to be the same as or substantially the same as (or similar to) a vacuum state.

The pressure control portion 80 may include a connection pipe 81 connected to the chamber 10, and a pump 82 provided on the connection pipe 81. Depending on the operation of the pump 82, external air may be introduced into the chamber 10 through the connection pipe 81, or the gas inside the chamber 10 may be guided to the outside through the connection pipe 81.

In a method of manufacturing a display apparatus by using the apparatus 2 for manufacturing a display apparatus as described above, the display substrate DS may first be prepared.

The pressure control portion 80 may maintain or substantially maintain the inside of the chamber 10 to be the same or substantially the same as (or similar to) the atmospheric pressure, and as the gate valve 11 is operated, the open portion of the chamber 10 may be opened.

Then, the display substrate DS may be loaded from the outside of the chamber 10 to the inside of the chamber 10. The display substrate DS may be loaded into the chamber 10 by various suitable methods. For example, the display substrate DS may be loaded from the outside of the chamber 10 into the inside of the chamber by a robot arm and/or the like disposed outside the chamber 10. In another embodiment, when the first support portion 20 is formed in the form of a shuttle, the first support portion 20 may be carried out from the inside of the chamber 10 to the outside of the chamber 10, the display substrate DS may be placed on the first support portion 20 by another robot arm and/or the like disposed outside the chamber 10, and the first support portion 20 may be loaded into the chamber 10 from the outside of the chamber 10.

The mask assembly 400 may be disposed in the chamber 10 as described above. In another embodiment, the mask assembly 400 may be loaded into the chamber 10 from the outside of the chamber 10 in a manner that is the same or substantially the same as (or similar to) that of the display substrate DS described above.

When the display substrate DS is loaded into the chamber 10, the display substrate DS may be placed on the first support portion 20. In this state, the vision portion 70 may capture images of the positions of the display substrate DS and the mask assembly 400. The positions of the display substrate DS and the mask assembly 400 may be identified based on the images captured by the vision portion 70. For example, the apparatus 2 for manufacturing a display apparatus may include a separate controller to identify the positions of the display substrate DS and the mask assembly 400.

When the identification of the positions of the display substrate DS and the mask assembly 400 is complete, the second support portion 30 may finely adjust the position of the mask assembly 400.

Then, as the deposition source 50 is operated, the deposition material may be supplied toward the mask assembly 400, and the deposition material having passed through a plurality of pattern holes of the mask sheet 420 may be deposited on the display substrate DS. In this state, the deposition source 50 may move parallel to or substantially parallel to the display substrate DS and the mask assembly 400, or the display substrate DS and the mask assembly 400 may move parallel to or substantially parallel to the deposition source 50. In other words, the deposition source 50 may move relative to the display substrate DS and the mask assembly 400. In this state, the pump 82 sucks out the gas in the chamber 10 and discharges the gas to the outside, so that the pressure in the chamber 10 may be maintained or substantially maintained to be the same or substantially the same as (or similar to) the vacuum state.

As described above, the deposition material supplied from the deposition source 50 passes through the mask assembly 400 to be deposited on the display substrate DS, and thus, at least one of a plurality of layers, for example, such as an organic layer, an inorganic layer, and/or a metal layer, to be stacked on a display apparatus described in more detail below, may be formed.

Figure 2:
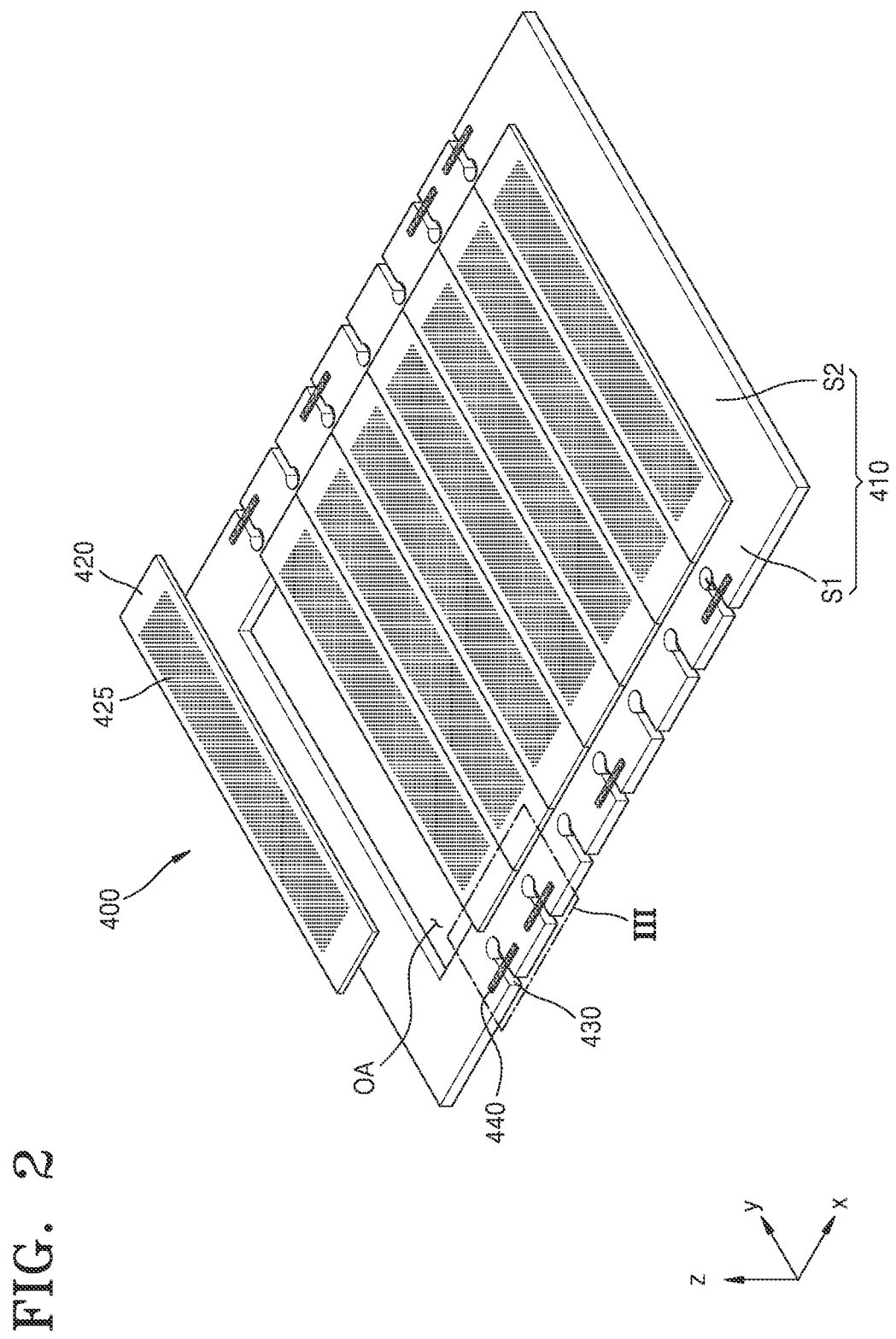
FIG. 2 is a schematic perspective view of a mask assembly according to an embodiment.

FIG. 2 is a schematic perspective view of the mask assembly 400 according to an embodiment.

Referring to FIG. 2, the mask assembly 400 may include the mask frame 410, the mask sheet 420, the gap portion 430, and the gap adjustment portion 440.

The mask frame 410 may be formed by connecting a plurality of sides to one another, and may have an opening area OA defined by the sides. In other words, the opening area OA may be surrounded (e.g., around a periphery thereof) by the sides, and the opening area OA penetrates the center of the mask frame 410. Support sticks that are parallel to or substantially parallel to each other in one direction may be disposed across the inside of the mask frame 410, or in other words, across the opening area OA. As another example, the support sticks crossing the opening area OA may be of a grid type.

In an embodiment, the mask frame 410 may be a rectangular frame. However, the shape of the mask frame 410 is not limited thereto, and the mask frame 410 may have various other suitable polygonal shapes. For convenience, a case in which the mask frame 410 is a rectangular frame is mainly described in more detail hereinafter.

When the mask frame 410 is a rectangular frame, the sides thereof may include a first side S1 extending in a first direction, for example, an x direction of FIG. 2, and a second side S2 extending in a second direction, for example, a y direction of FIG. 2, that crosses the first direction. The first side S1 is provided in a pair to face each other, and the second side S2 is provided in a pair to face each other. The first side S1 and the second side S2 may be connected to each other. In an embodiment, the first side S1 may be a long side, and the second side S2 may be a short side. However, the present disclosure is not limited thereto, and the first side S1 may be a short side and the second side S2 may be a long side, or the lengths of both of the first side S1 and the second side S2 may be the same or substantially the same as each other. For convenience, a case in which the first side S1 is the long side and the second side S2 is the short side is mainly described in more detail hereinafter.

The mask sheet 420 may be provided, in a tensioned state, on the mask frame 410. The opening area OA at the center of the mask frame 410 may be covered by the mask sheet 420. In an embodiment, the mask sheet 420 may include at least one mask sheet, and when the mask sheet 420 includes two or more mask sheets, the mask sheets 420 may be disposed on the mask frame 410 to be parallel to or substantially parallel to each other. For example, the mask sheets 420 may be arranged in parallel to or substantially in parallel to each other in one direction, for example, such as the x direction of FIG. 2. In this state, each of the mask sheets 420 may have a shape having a long side extending in a direction, for example, such as the y direction of FIG. 2, crossing the one direction. Opposite end portions of each of the mask sheets 420 may be fixed to the mask frame 410 by a suitable method, for example, such as welding.

The mask sheet 420 may include at least one pattern hole 425. The pattern hole 425 may be a through-hole formed to allow a deposition material to pass through the mask sheet 420. The deposition material having passed through the mask sheet 420 may be deposited on the display substrate DS.

Figure 3:
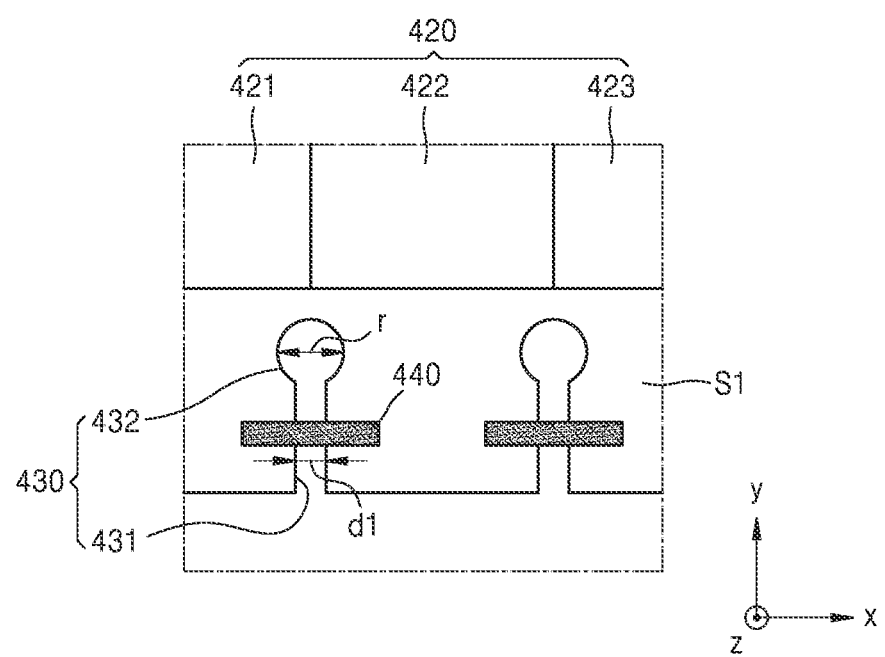
FIGS. 3-4 are enlarged plan views of the region III of the mask assembly of FIG. 2.
Figure 4:
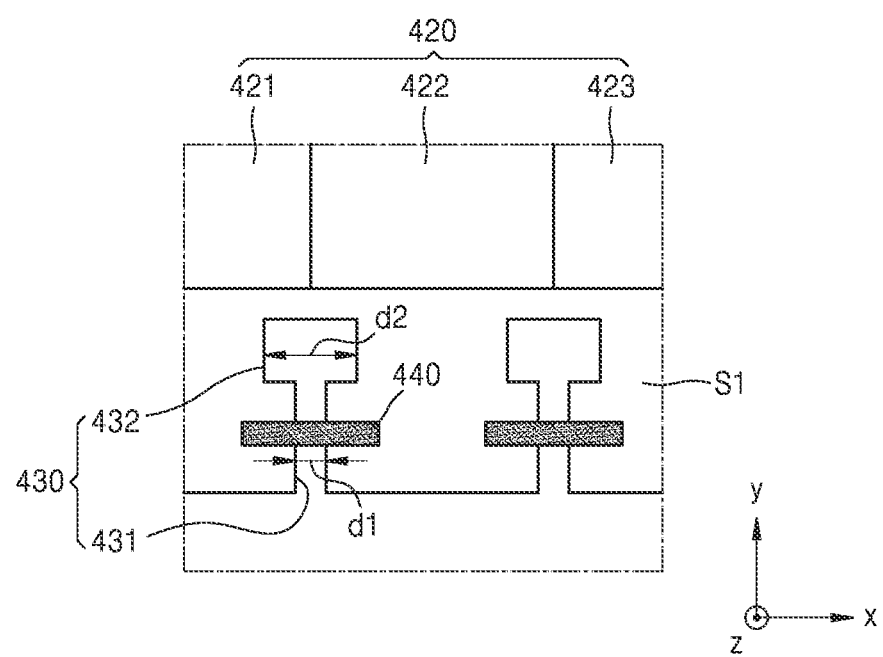

FIGS. 3 and 4 are enlarged plan views of the region III of the mask assembly 400 of FIG. 2.

Referring to FIG. 3, the mask assembly 400 may include the gap portion 430 and the gap adjustment portion 440.

The gap portion 430 may be disposed in the first side S1 that extends in a first direction, such as the x direction of FIG. 3, of the mask frame 410. In an embodiment, the gap portion 430 may be recessed inwardly from the outside of a perimeter of the first side S1 in a −y direction of FIG. 3 to the inside in a +y direction of FIG. 3. In other words, the gap portion 430 may be a groove recessed in a direction crossing the first direction, for example, such as a direction perpendicular to or substantially perpendicular to the first direction.

In an embodiment, the gap portion 430 may include a first portion 431 and a second portion 432.

The first portion 431 may be a portion that is inwardly recessed in the first side S1 in the direction perpendicular to or substantially perpendicular to the first direction. The first portion 431 may be of an elongated type in which the length in the y direction of FIG. 3 is greater than the width d1 in the x direction of FIG. 3. Although FIG. 3 illustrates a case in which the width d1 of the first portion 431 is constant or substantially constant, in another embodiment, the width d1 of the first portion 431 may gradually decrease from the outside toward the inside, or in other words, in a reverse V shape.

The second portion 432 may be formed in one end portion of the first portion 431 in the first side S1. The second portion 432 may be formed such that a width of at least one portion of the second portion 432 is greater than the width d1 of the first portion 431. In an embodiment, the second portion 432 may be circular when viewed in a plane (e.g., in a plan view). A diameter r of the second portion 432 may be greater than the width d1 of the first portion 431.

The gap portion 430 may form a gap in the mask frame 410 through the width d1 of the first portion 431. Accordingly, stretching and contraction of the first side S1 of the mask frame 410 may be controlled by adjusting the gap through the gap adjustment portion 440 described in more detail below.

Furthermore, the gap portion 430 includes, as illustrated in FIG. 3, the first portion 431 of an elongated type and the second portion 432 of a circular type, and thus, concentration of stress that may occur may be reduced, because the gap portion 430 is provided in the mask frame 410. In more detail, as the second portion 432 of the gap portion 430 is formed to be circular, when the gap of the gap portion 430 is increased or decreased, stress intensively applied to the gap portion 430, in particular, to the second portion 432, may be distributed.

Referring to FIG. 4, in another embodiment, the second portion 432 of the gap portion 430 may be rectangular when viewed in a plane (e.g., in a plan view). A width d2 of the second portion 432 may be greater than the width d1 of the first portion 431. In this case, as described above, when the gap of the gap portion 430 is increased or decreased, stress to be applied to the second portion 432 may be distributed. As another example, the gap portion 430 may be formed with the first portion 431, and without the second portion 432. In other words, the gap portion 430 may be a rectangle that is elongated in one direction when viewed in a plane (e.g., in a plan view). For convenience, a case in which the shape of the gap portion 430 is that as illustrated in FIG. 3 is mainly described in more detail hereinafter.

Referring back to FIG. 3, the gap adjustment portion 440 may be disposed on the mask frame 410 and the gap portion 430. In more detail, the gap adjustment portion 440 may be connected to the first side S1 of the mask frame 410 adjacent to the left side and right side of the gap portion 430, for example, at end portions at the sides in the +x and −x directions of FIG. 3 of the gap portion 430, across the gap portion 430. The gap adjustment portion 440 may have a stick shape that extends longer in the first direction (e.g., the x direction of FIG. 3) than in the second direction (e.g., the y direction of FIG. 3), and is welded and fixed to the first side S1 across the gap portion 430. The gap adjustment portion 440 may be welded in a tensioned state in the first direction. Accordingly, the gap adjustment portion 440 may adjust the gap of the gap portion 430. The gap adjustment portion 440 that is tensile-welded to the gap portion 430 contracts after the welding is complete, so that the gap is adjusted by narrowing the gap of the gap portion 430.

As another example, the gap adjustment portion 440 may be in a state of being tensioned and connected to the mask frame 410 across the gap portion 430, and thus, the gap of the gap portion 430 may be in a narrowed state. In this state, as the gap adjustment portion 440 may be disconnected by removing the welding of the gap adjustment portion 440, the gap of the gap portion 430 may be increased, and thus, the gap may be adjusted.

As such, a degree of the stretching and contraction of the first side S1 of the mask frame 410 may be adjusted through the gap portion 430 and the gap adjustment portion 440. Accordingly, after the mask sheet 420 is fixed to the mask frame 410 by welding, when the deposition material is not deposited in a desired area of a display substrate DS (e.g., see FIG. 1) due to deformation, such as sagging of the mask sheet 420, the alignment of the mask sheet 420 may be adjusted by stretching and/or contracting the lengths of the sides of the mask frame 410.

Generally, when the mask sheet 420 and the mask frame 410 are not aligned with each other as desired, in order for realignment, the mask sheet 420 that is welded may be removed and then welded again to the mask frame 410. In this case, manpower to remove the mask sheet 420 that is welded may be increased, and raw materials of the mask sheet 420 may be increased, such that manufacturing costs and time may be increased.

According to one or more embodiments of the present disclosure, in the mask assembly 400, the alignment relation of the mask sheet 420 and the mask frame 410 may be adjusted by adjusting the length of the mask frame 410 through the gap portion 430 and the gap adjustment portion 440, without removing the mask sheet 420 that is welded.

According to an embodiment, the gap portion 430 may include a plurality of gap portions that are disposed to be spaced apart from each other in the first direction (e.g., the x direction of FIG. 3). The mask sheet 420 may include one mask sheet or two or more mask sheets, for example, such that the mask sheet 420 may include three or more mask sheets including a first mask sheet 421, a second mask sheet 422 adjacent to the first mask sheet 421, and a third mask sheet 423 adjacent to the second mask sheet 422. As the plurality of mask sheets 421, 422, and 423 may be the same or substantially the same as (or similar to) one another, for convenience, the first mask sheet 421 and the second mask sheet 422 are mainly described in more detail hereinafter.

The first mask sheet 421 and the second mask sheet 422 may be disposed on the mask frame 410 to be parallel to or substantially parallel to each other in the first direction. The first mask sheet 421 and the second mask sheet 422 may each have a shape extending longer in the second direction (e.g., the y direction of FIG. 3) perpendicular to or substantially perpendicular to the first direction than in the first direction. Opposite end portions of the first mask sheet 421 and the second mask sheet 422 in the second direction may be welded and fixed to the sides, for example, such as the first sides S1, of the mask frame 410.

The gap portion 430 may include a plurality of gap portions that are disposed between the mask sheets 420, respectively. For example, the gap portion 430 may be disposed between the first mask sheet 421 and the second mask sheet 422. The arrangement of the gap portion 430 between the first mask sheet 421 and the second mask sheet 422 may mean that the gap portion 430 is disposed to be spaced apart from the first mask sheet 421 and the second mask sheet 422 in the second direction, and may be disposed between the first mask sheet 421 and the second mask sheet 422 in the first direction. In other words, when viewed in the second direction (e.g., the y direction of FIG. 3), the gap portion 430 may overlap with a portion of the first mask sheet 421 and a portion of the second mask sheet 422. As the gap portion 430 is disposed between the mask sheets 420, the length of the mask frame 410 may be adjusted more finely, considering the alignment relation between the mask sheets 420. For example, when a distance between the first mask sheet 421 and the second mask sheet 422 is decreased, the gap adjustment portion 440 may be stretched and welded. In this case, when no adjustment of the distance of the second mask sheet 422 and the third mask sheet 423 is desired, the gap adjustment portion 440 may not be tensile-welded. In other words, while the gap adjustment portion 440 may be disposed in some of the gap portions 430, the gap adjustment portion 440 may not be disposed in others of the gap portions 430.

Figure 5:
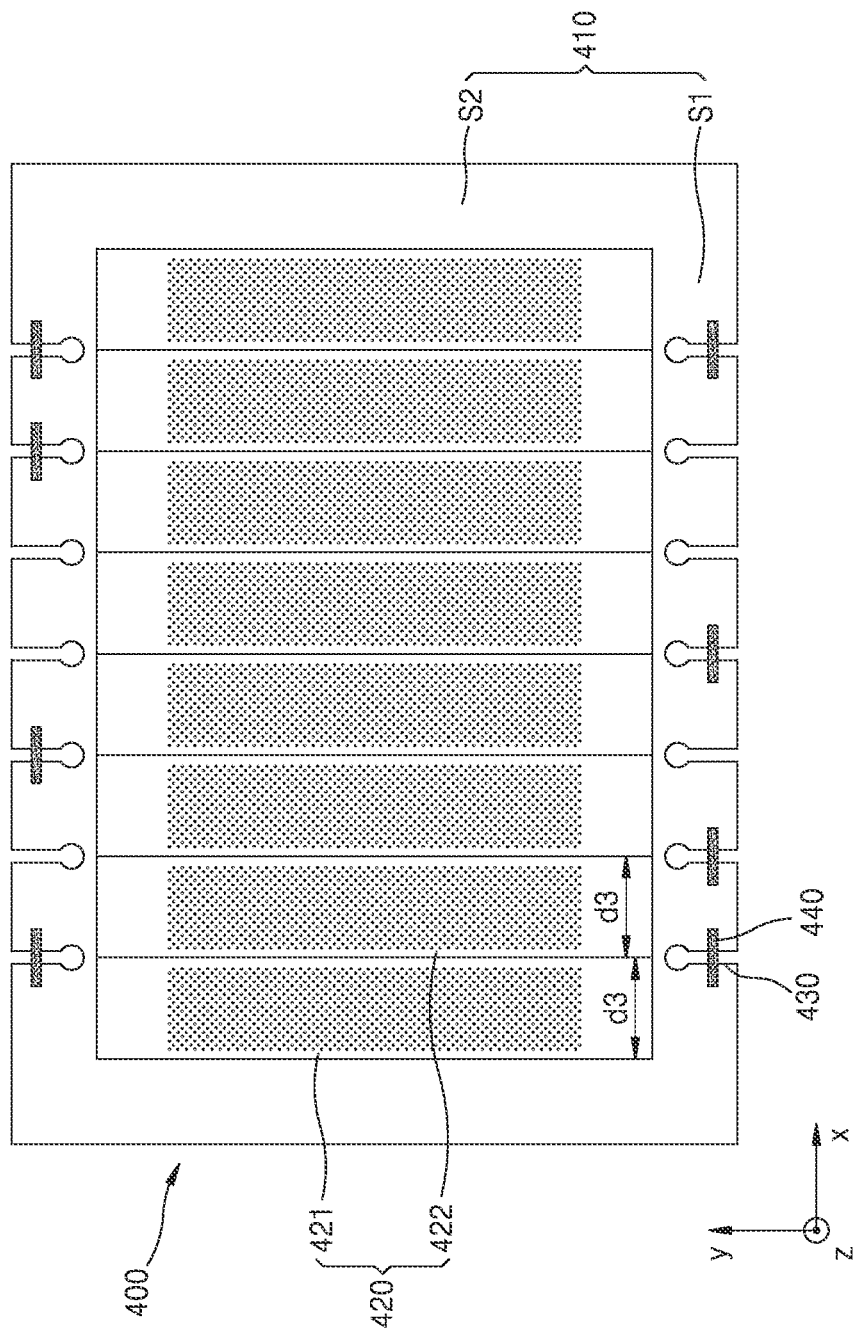
FIG. 5 is a schematic plan view of a mask assembly according to another embodiment.

FIG. 5 is a schematic plan view of the mask assembly 400 according to another embodiment. In FIG. 5, the same or substantially the same (or similar) elements and components as those of one or more embodiments described above may be denoted with the same reference symbols, and thus, redundant description thereof may not be repeated, and the differences between the embodiments may be mainly described.

Referring to FIG. 5, in an embodiment, the gap portions 430 may be disposed to correspond to the mask sheets 420. In other words, each of the gap portions 430 may be positioned between widths d3 of the mask sheets 420 corresponding thereto in the first direction (e.g., the x direction of FIG. 5). In other words, while being spaced apart from the first mask sheet 421 and the second mask sheet 422 in the second direction, the gap portion 430 may be disposed, in the first direction, within each of the width d3 of the first mask sheet 421 and the width d3 of the second mask sheet 422. In this state, each of the gap portions 430 may overlap with each of the first mask sheet 421 and the second mask sheet 422 when viewed in the second direction (e.g., the y direction of FIG. 5). As each of the gap portions 430 is disposed within the width d3 of each of the first mask sheet 421 and the second mask sheet 422, a relative position of each of the mask sheets may be effectively adjusted.

Figure 6:
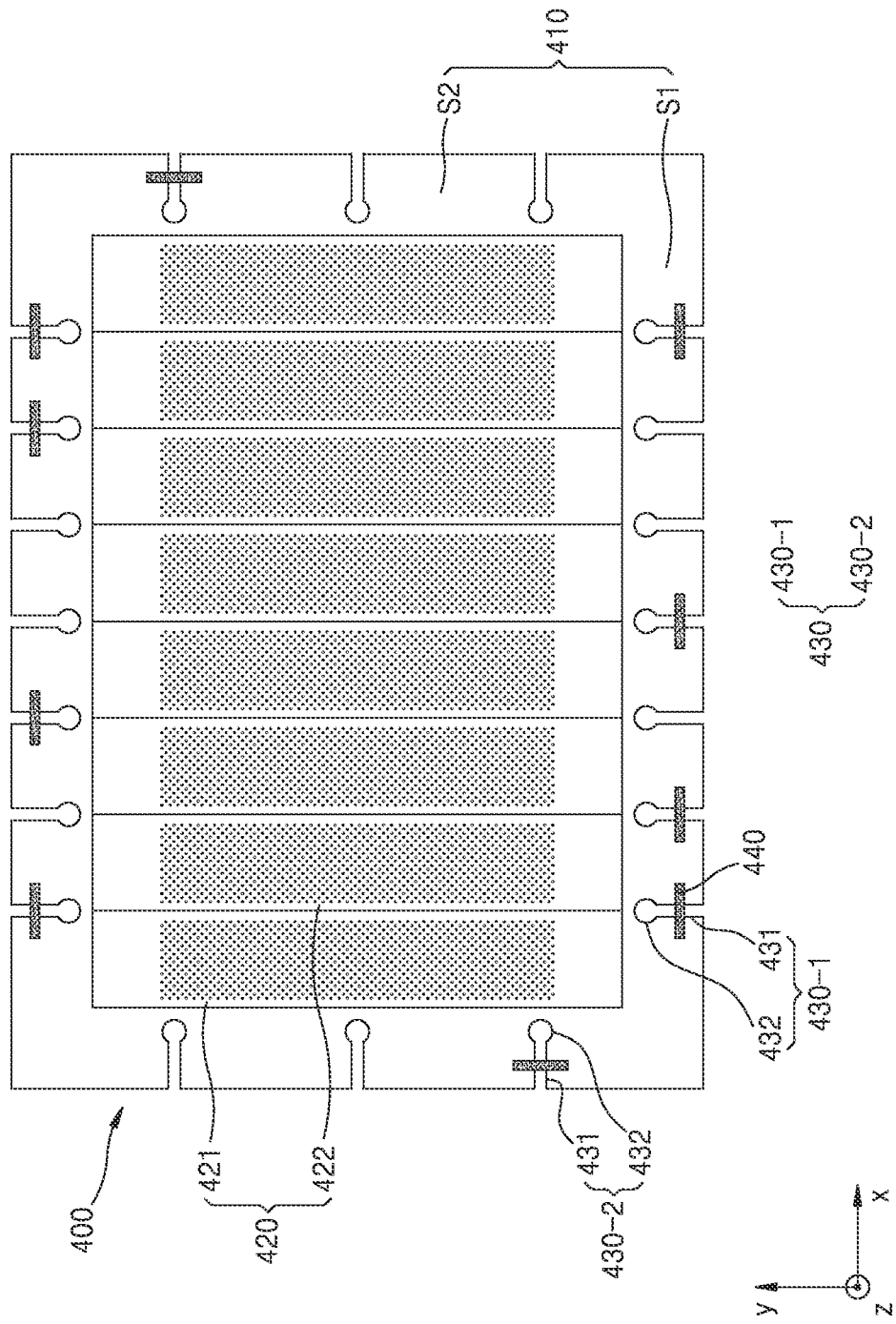
FIG. 6 is a schematic plan view of a mask assembly according to another embodiment.

FIG. 6 is a schematic plan view of the mask assembly 400 according to another embodiment. In FIG. 6, the same or substantially the same (or similar) elements and components as those of one or more embodiments described above may be denoted with the same reference symbols, and thus, redundant description thereof may not be repeated, and the differences between the embodiments may be mainly described.

Referring to FIG. 6, the gap portion 430 may be further disposed in the second side S2 of the mask frame 410 extending in the second direction (e.g., the y direction of FIG. 6). In other words, the gap portion 430 may include a first gap portion 430-1 disposed in the first side S1, and a second gap portion 430-2 disposed in the second side S2. As the first gap portion 430-1 is the same or substantially the same as (or similar to) the gap portion 430 described above with reference to FIGS. 3 to 5, redundant description thereof may not be repeated, and the second gap portion 430-2 may be mainly described in more detail hereinafter.

The second gap portion 430-2 may be formed by recessing from the outside of the perimeter of the second side S2 (e.g., in a −x direction based on the second side in the −x direction in FIG. 6) to the inside (e.g., in a +x direction based on the second side in the +x direction in FIG. 6). In other words, the second gap portion 430-2 may be a groove recessed in a direction crossing the second direction, for example, such as a direction perpendicular to or substantially perpendicular to the second direction.

The shape of the second gap portion 430-2 is the same or substantially the same as (or similar to) the gap portion 430 described above, and may include the first portion 431 and the second portion 432. The second portion 432 may be circular or rectangular when viewed in a plane (e.g., in a plan view). Furthermore, in another embodiment, the second portion 432 may be omitted as needed or desired.

In an embodiment, the shape of the second gap portion 430-2 may be the same or substantially the same as (or similar to) the shape of the first gap portion 430-1, as illustrated in FIG. 6. However, the present disclosure is not limited thereto, and the shape of the second gap portion 430-2 may be different from that of the first gap portion 430-1. For example, the second portion 432 of the first gap portion 430-1 may be formed to be circular, and the second portion 432 of the second gap portion 430-2 may be formed to be rectangular. Considering that the first side S1 that is a long side may be deformed more in the mask frame 410, the adjustment of the length of the first side S1 may be more desired. Accordingly, during the length adjustment of the first side S1, the concentration of stress applied to the first gap portion 430-1 may be reduced through the second portion 432 that is circular. Furthermore, in the second side S2 having a relatively small deformation, so that a degree of adjustment is relatively smaller, the gap portion 430 may be formed by forming the second portion 432 in a rectangle having the same or substantially the same width as that of the first portion 431, or omitting the second portion 432, so that a decrease in stiffness of the mask frame 410 may be reduced.

In an embodiment, the second gap portion 430-2 may include a plurality of second gap portions that are disposed to be spaced apart from each other in the second direction (e.g., the y direction of FIG. 6). The number of second gap portions 430-2 may be less than the number of first gap portions 430-1. For example, as illustrated in FIG. 6, the first gap portion 430-1 may include seven first gap portions, and the second gap portion 430-2 may include three second gap portions. However, the present disclosure is not limited thereto, and the second gap portion 430-2 may include three or less second gap portions.

As described above, as the gap adjustment portion 440 is tensile-welded to the second gap portion 430-2, the gap of the second gap portion 430-2 is decreased, so that the gap may be adjusted. As another example, the gap adjustment portion 440 may be in a state of being tensioned and connected to the second gap portion 430-2, and thus, the gap of the second gap portion 430-2 may be in a narrowed state. In this case, as the gap adjustment portion 440 is disconnected by removing the welding of the gap adjustment portion 440, the gap of the second gap portion 430-2 may be increased, and thus, the gap may be adjusted.

Furthermore, although FIGS. 2 to 6 illustrate a case in which the gap portion 430 is disposed in the first side S1, or in the first side S1 and the second side S2, it should be understood that the gap portion 430 may be disposed only in the second side S2.

Figure 7:
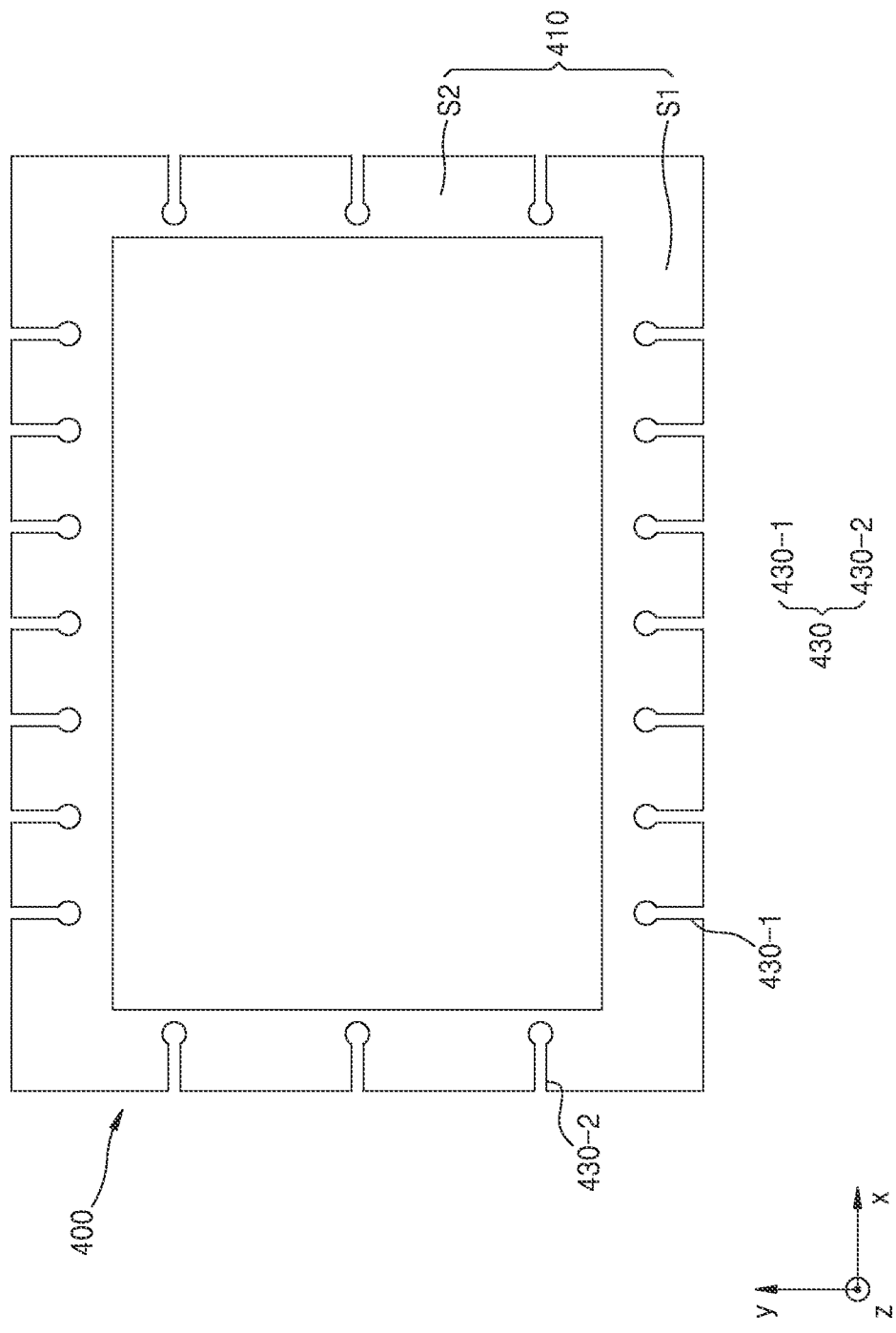
FIGS. 7-9 are schematic plan views showing a method of manufacturing a display apparatus, according to an embodiment.
Figure 8:
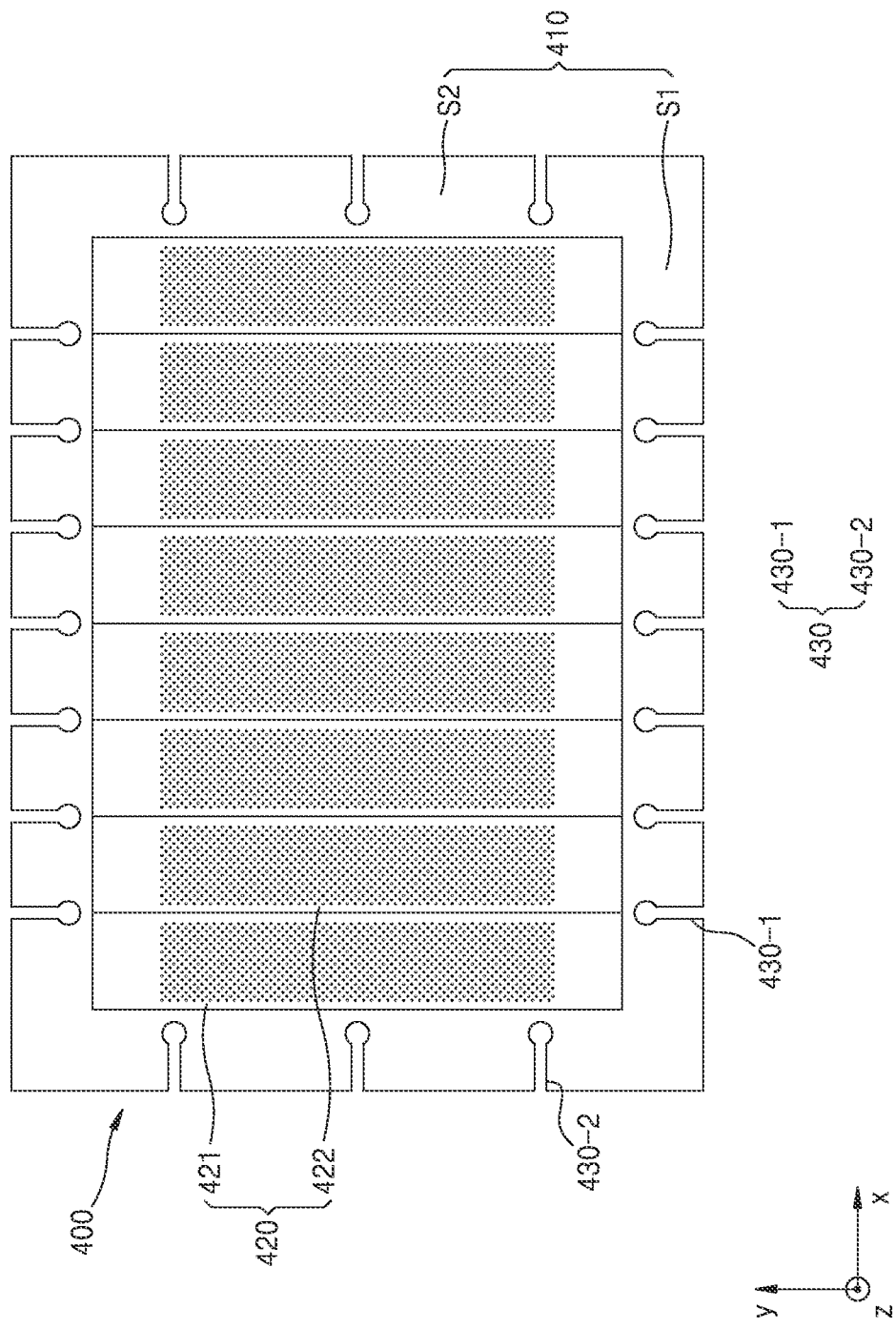
Figure 9:
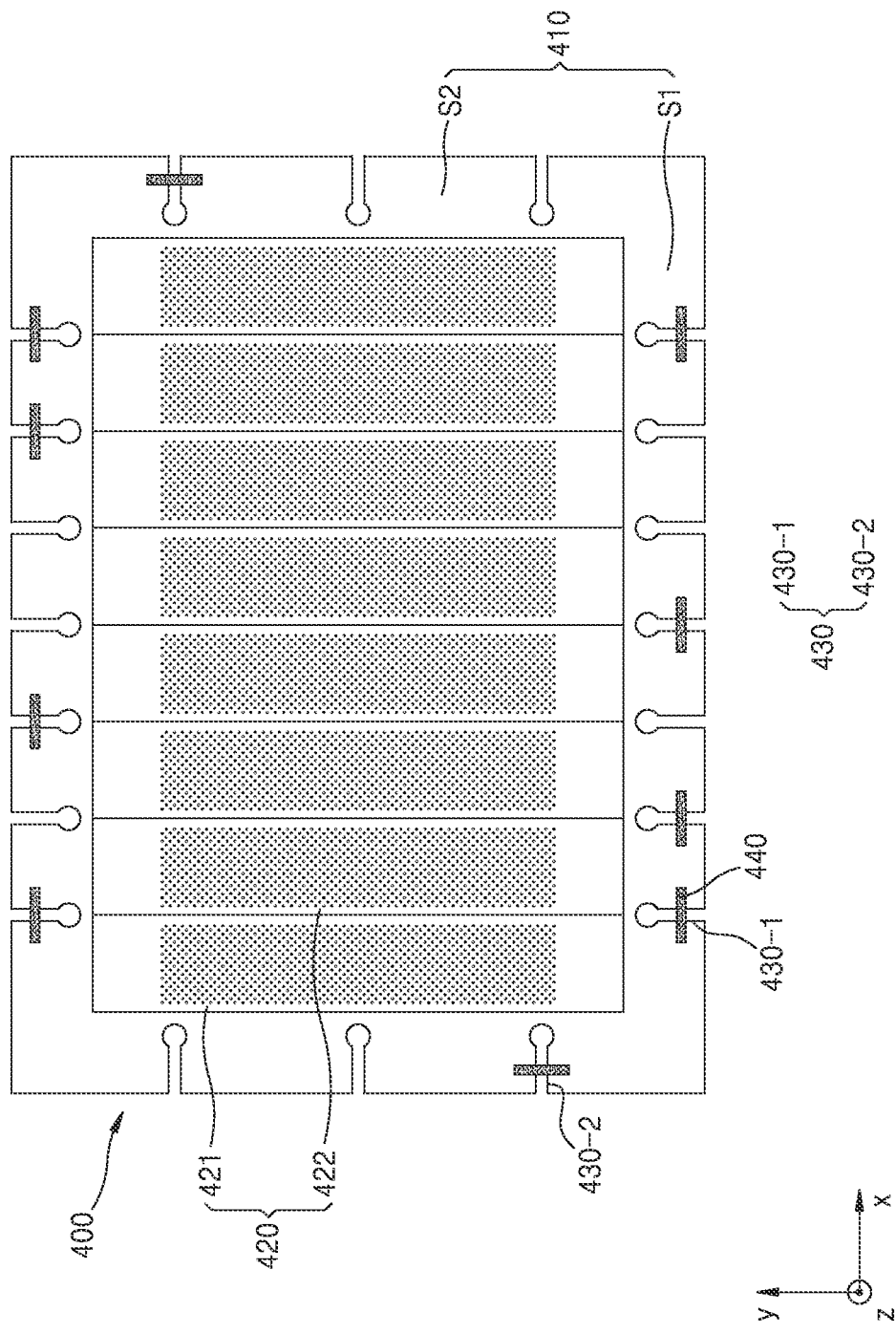

FIGS. 7 to 9 are schematic plan views showing a method of manufacturing a display apparatus, according to an embodiment. The method of manufacturing the display apparatus may be a method that uses the apparatus 2 for manufacturing a display apparatus including the mask assembly according to one or more embodiments described above.

Referring to FIG. 7, the mask frame 410 may be prepared. As described above, the mask frame 410 may include the gap portions 430, for example, such as the first gap portion 430-1 and the second gap portion 430-2 that are disposed in the first side S1 and the second side S2. However, it will be understood that the gap portions 430 may be disposed only in the first side S1 or only in the second side S2 as described with reference to one or more embodiments above.

Referring to FIG. 8, the mask sheet 420 may be disposed on the mask frame 410. In an embodiment, the mask sheet 420 may include a plurality of mask sheets including the first mask sheet 421 and the second mask sheet 422. As the mask sheets 420 are the same or substantially the same as (or similar to) each other, the first mask sheet 421 and the second mask sheet 422 are mainly described in more detail hereinafter. The first mask sheet 421 and the second mask sheet 422 may be welded and fixed to the mask frame 410 at opposite end portions thereof in the second direction (e.g., the y direction of FIG. 8). Furthermore, outer parts of portions of the first mask sheet 421 and the second mask sheet 422 that are welded at opposite end portions thereof in the second direction are cut off after the welding is complete, and are aligned as illustrated in FIG. 8, so that the mask assembly 400 may be formed.

Next, the alignment of the mask sheet 420 in the mask assembly 400 may be examined. For example, in an embodiment, as shown in the operation of the apparatus 2 for manufacturing a display apparatus described above, the mask assembly 400 is disposed to face the display substrate DS to be used for deposition of a deposition material. Next, the alignment of the mask sheet 420 may be examined by examining the layer arrangement of the display substrate DS of FIG. 1 that is deposited.

Referring to FIG. 9, as a result of the examination of the alignment of the mask sheet 420, when the adjustment of the alignment of the mask sheet 420 is desired, the gap adjustment portion 440 may be disposed across the gap portion 430. For example, when the adjustment of the alignment in the first direction (e.g., the x direction of FIG. 9) of the mask sheet 420 is desired, as illustrated in FIG. 9, the gap adjustment portion 440 may be disposed in a portion of the first gap portion 430-1, for example, such as in the first gap portion 430-1 adjacent to the portion of the mask frame 410 that is to be adjusted. The gap adjustment portion 440 may be disposed in a tensioned state in the first direction (e.g., the x direction of FIG. 9) across the first gap portion 430-1, and opposite end portions thereof may be welded and fixed to the mask frame 410. Accordingly, as the gap adjustment portion 440 is gradually contracted again, the gap of the first gap portion 430-1 decreases, and the length of the first side S1 of the mask frame 410 may be decreased around the first gap portion 430-1. As such, by adjusting the length of the first side S1, the alignment of the mask sheet 420 welded to the first side S1 may be finely adjusted. Furthermore, as the deposition material is deposited in a desired area in the display substrate DS, deposition quality may be improved.

As a result of the examination of the alignment of the mask sheet 420, when the adjustment of alignment of the mask sheet 420 in the second direction (e.g., the y direction of FIG. 9) is desired, the gap adjustment portion 440 may be disposed in a portion of the second gap portion 430-2, such as in the second gap portion 430-2 adjacent to the portion of the mask frame 410 that is to be adjusted. The gap adjustment portion 440 may be disposed in a tensioned state in the second direction (e.g., the y direction of FIG. 9) across the second gap portion 430-2, and opposite end portions thereof may be welded and fixed to the mask frame 410. As the method of adjusting the length of the second side S2 by the gap adjustment portion 440 is similar to the above-described method, redundant description thereof may not be repeated.

Figure 10:
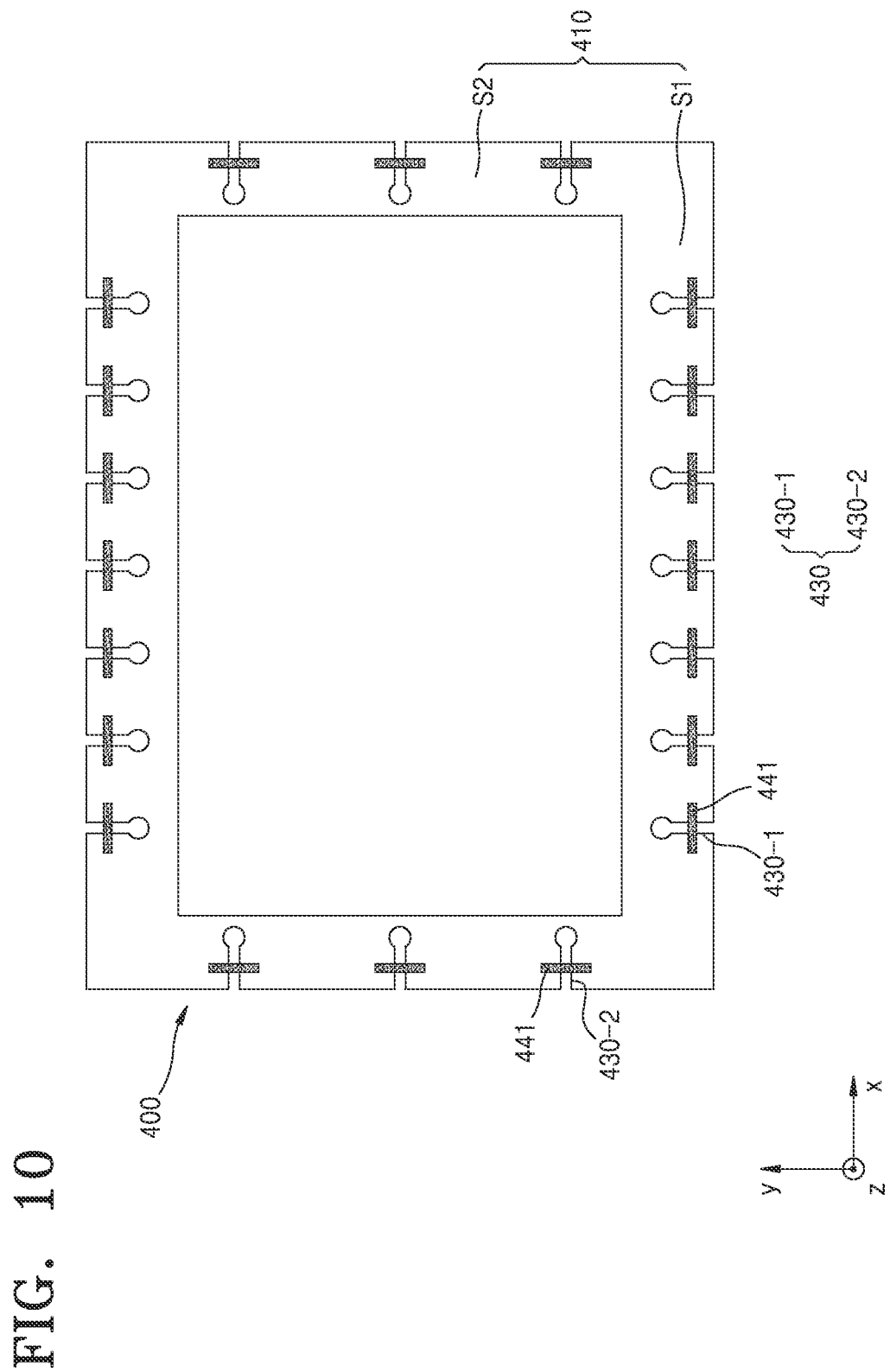
FIGS. 10-12 are schematic plan views showing a method of manufacturing a display apparatus, according to another embodiment.
Figure 11:
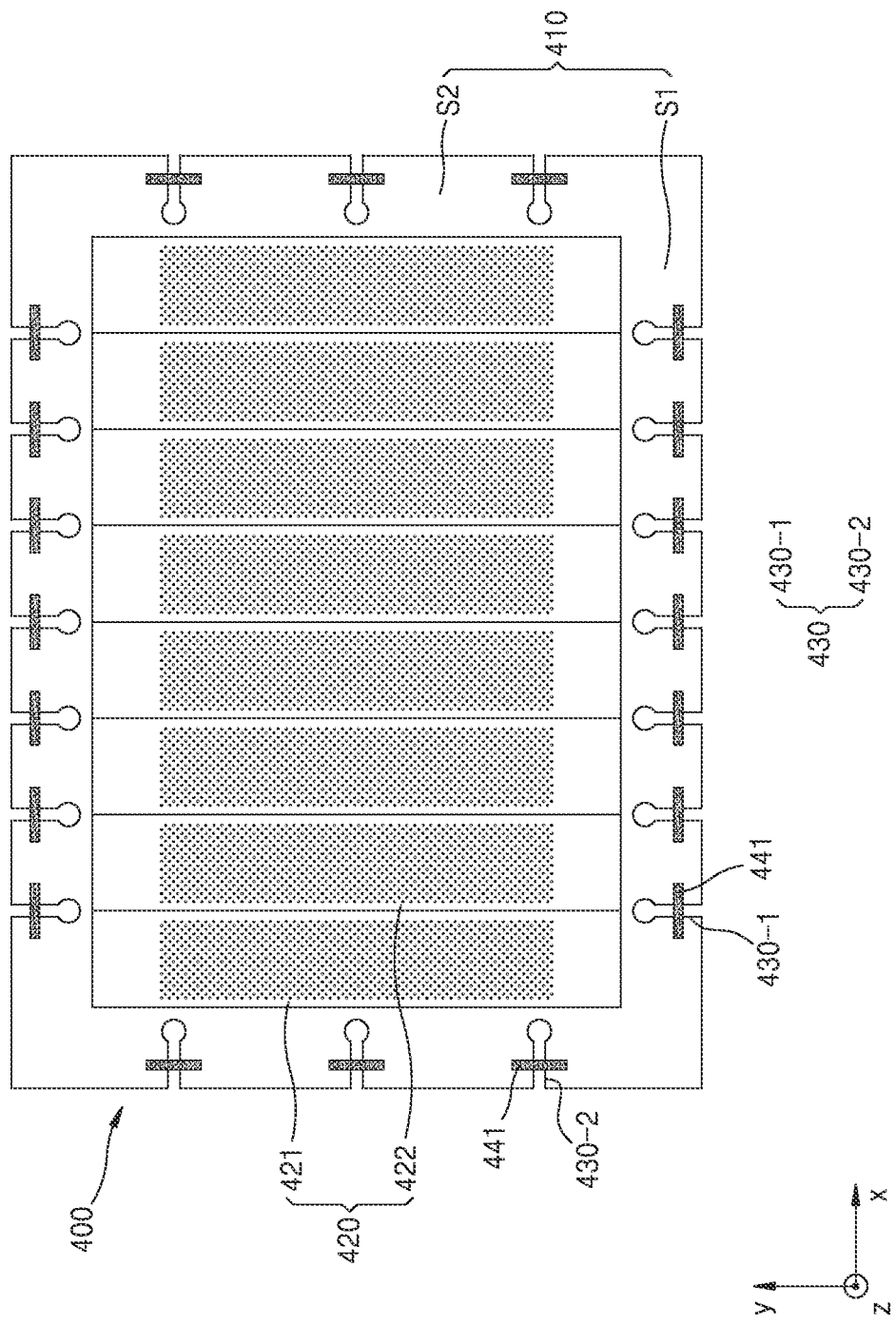
Figure 12:
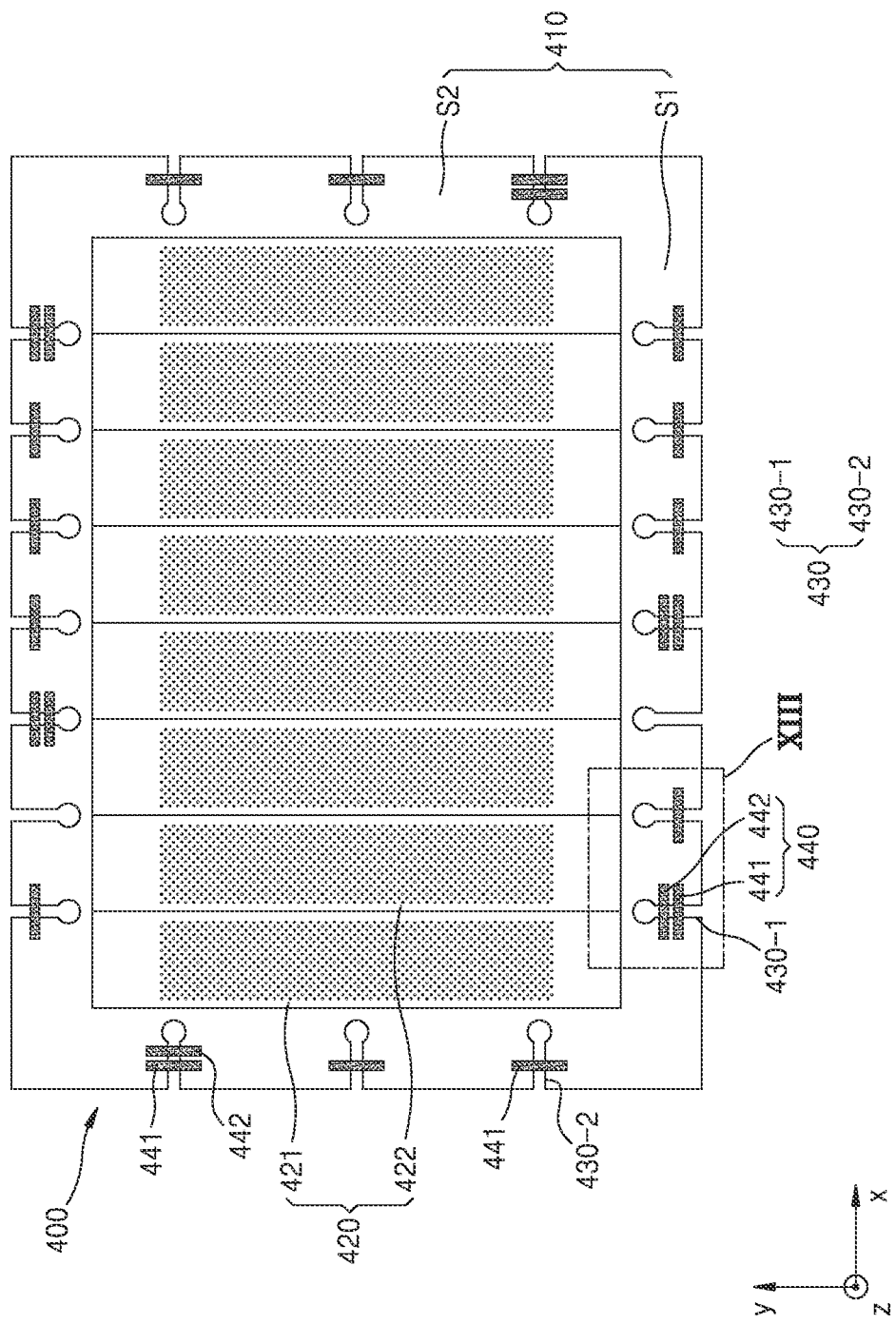

FIGS. 10 to 12 are schematic plan views showing a method of manufacturing a display apparatus, according to another embodiment. As the method of manufacturing the display apparatus according to the embodiment shown in FIGS. 10 to 12 may be the same or substantially the same as (or similar to) that described above with reference to FIGS. 7 to 9, redundant description thereof may not be repeated, and the differences therebetween may be mainly described in more detail hereinafter.

Referring to FIG. 10, the mask frame 410 may be prepared. A first gap adjustment portion 441 may be disposed in the first side S1 and the second side S2 of the mask frame 410 across the first gap portion 430-1 and the second gap portion 430-2. In other words, the first gap adjustment portion 441 may include a plurality of first gap adjustment portions, and each corresponding one of the first gap adjustment portions 441 may extend along the first side S1 in the first direction (e.g., the x direction of FIG. 10) across the first gap portion 430-1, or along the second side S2 in the second direction (e.g., they y direction of FIG. 10) across the second gap portion 430-2. The first gap adjustment portion 441 may be disposed in all of the first gap portion 430-1 and the second gap portion 430-2. In this state, opposite end portions of the first gap adjustment portion 441, as described above, may be welded and fixed, in a tensioned state, to the mask frame 410. Accordingly, the first side S1 and the second side S2 of the mask frame 410 may be in a state in which the first gap portion 430-1 and the second gap portion 430-2 are narrowed by the first gap adjustment portion 441.

Referring to FIG. 11, the mask sheets 420 including the first mask sheet 421 and the second mask sheet 422 may be disposed on the mask frame 410. As described above, the mask sheets 420 may be welded and fixed to the mask frame 410.

Next, as described above, the alignment of the mask sheet 420 in the mask assembly 400 may be examined.

Referring to FIG. 12, as a result of the examination of the alignment of the mask sheet 420, when the adjustment of the alignment of the mask sheet 420 is desired, the gap adjustment portion 440 may be used. In more detail, as the gap adjustment portion 440 is disposed in, or removed from, the first gap portion 430-1 or the second gap portion 430-2 that is adjacent to a portion where the adjustment of the length in the first side S1 or the second side S2 of the mask frame 410 is desired, the length of the first side S1 or the second side S2 may be adjusted.

Figure 13:
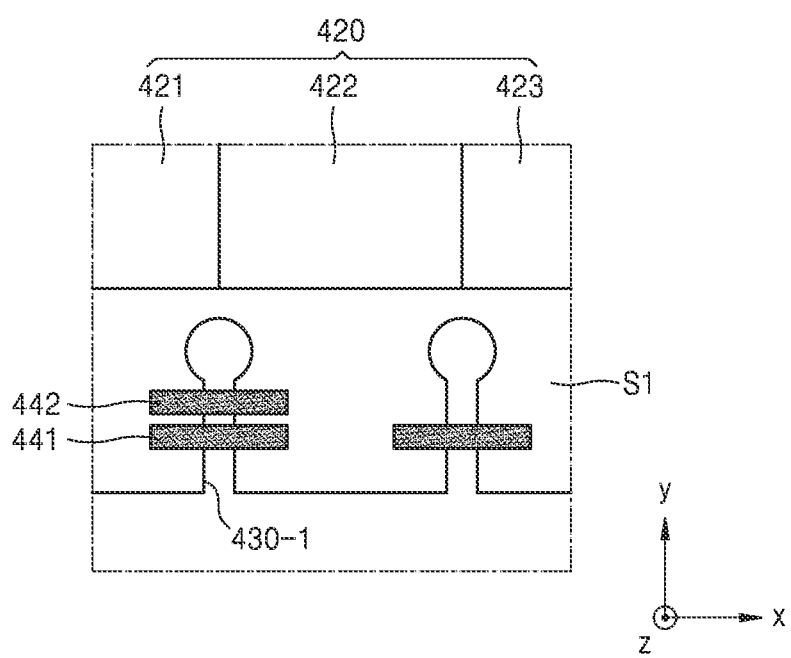
FIGS. 13-14 are enlarged plan views of the region XIII of FIG. 12.
Figure 14:
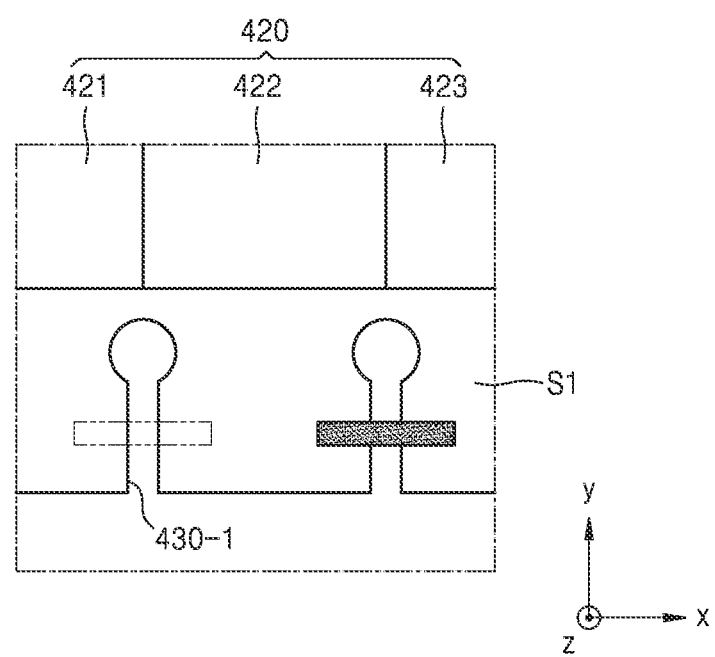

FIGS. 13 and 14 are enlarged views of the region XIII of FIG. 12. The adjustment of the length of the first side S1 or the second side S2 through the gap adjustment portion 440 is described in more detail below with reference to FIGS. 13 and 14.

As the mask sheet 420 is to be aligned in the first direction (e.g., the x direction of FIG. 13), the adjustment of the length of the first side S1 may be desired. For example, when the gap between the first mask sheet 421 and the second mask sheet 422 in the first side S1 is to be decreased, the gap of the first gap portion 430-1 adjacent thereto may be decreased. For example, as illustrated in the first gap portion 430-1 on the left side of FIG. 13, a second gap adjustment portion 442 may be disposed in the first gap portion 430-1. In this state, similar to the above, opposite end portions of the second gap adjustment portion 442 may be welded and fixed, in a tensioned state, to the first side S1 in the first direction. Accordingly, the gap of the first gap portion 430-1 in which the first gap adjustment portion 441 is welded may be decreased further by the second gap adjustment portion 442.

In an embodiment, the second gap adjustment portion 442 may have the same or substantially the same stick shape as that of the first gap adjustment portion 441. Furthermore, the second gap adjustment portion 442 may be disposed to be spaced apart from the first gap adjustment portion 441 in the second direction (e.g., the +y direction of FIG. 12). As another example, the second gap adjustment portion 442 may be disposed to be spaced apart from the first gap adjustment portion 441 in the opposite direction of the second direction (e.g., the −y direction in FIG. 12). In this state, the second gap adjustment portion 442 may be disposed to be parallel to or substantially parallel to the first gap adjustment portion 441.

Referring to FIG. 14, for example, when the gap between the first mask sheet 421 and the second mask sheet 422 in the first side S1 is to be increased, the gap of the first gap portion 430-1 adjacent thereto may be increased. For example, as illustrated in the first gap portion 430-1 on the left side of FIG. 14, the first gap adjustment portion 441 disposed in the first gap portion 430-1 may be removed. Accordingly, the gap of the first gap portion 430-1 that has been narrowed by the first gap adjustment portion 441 may be widen.

As such, the length of the first side S1 is adjusted by adjusting the gap of the first gap portion 430-1, and thus, the alignment of the mask assembly 420 in the first direction may be adjusted. Although, for convenience, the first gap portion 430-1 of the first side S1 is described in more detail as an example, the gap of the second gap portion 430-2 of the second side S2 may be adjusted similarly to the above-described method to adjust the alignment of the mask assembly 420 in the second direction.

Furthermore, it will be understood that the gaps of the first gap portions 430-1 and the second gap portions 430-2 may be separately adjusted. In FIG. 12, as an example, some of the gap portions 430 are left with the first gap adjustment portion 441 disposed thereon, because the gap adjustment is not desired, while some of the gap portions 430 are left with the second gap adjustment portion 442 additionally disposed thereon to decrease the gap thereof, and some other gap portions 430 are removed of the first gap adjustment portion 441 to increase the gap thereof. However, the present disclosure is not limited thereto, and for example, the second gap adjustment portion 442 may be further disposed on all of the gap portions 430, or the first gap adjustment portion 441 may be removed from all of the gap portions 430, as needed or desired.

As such, according to the method of manufacturing a display apparatus, according to an embodiment, when the alignment of the mask sheet 420 in the mask assembly 400 is to be readjusted, the alignment of the mask sheet 420 may be readjusted by adjusting the gap of the gap portion 430, without removing the mask sheet 420 that is welded and disposing and welding the same again.

Figure 15:
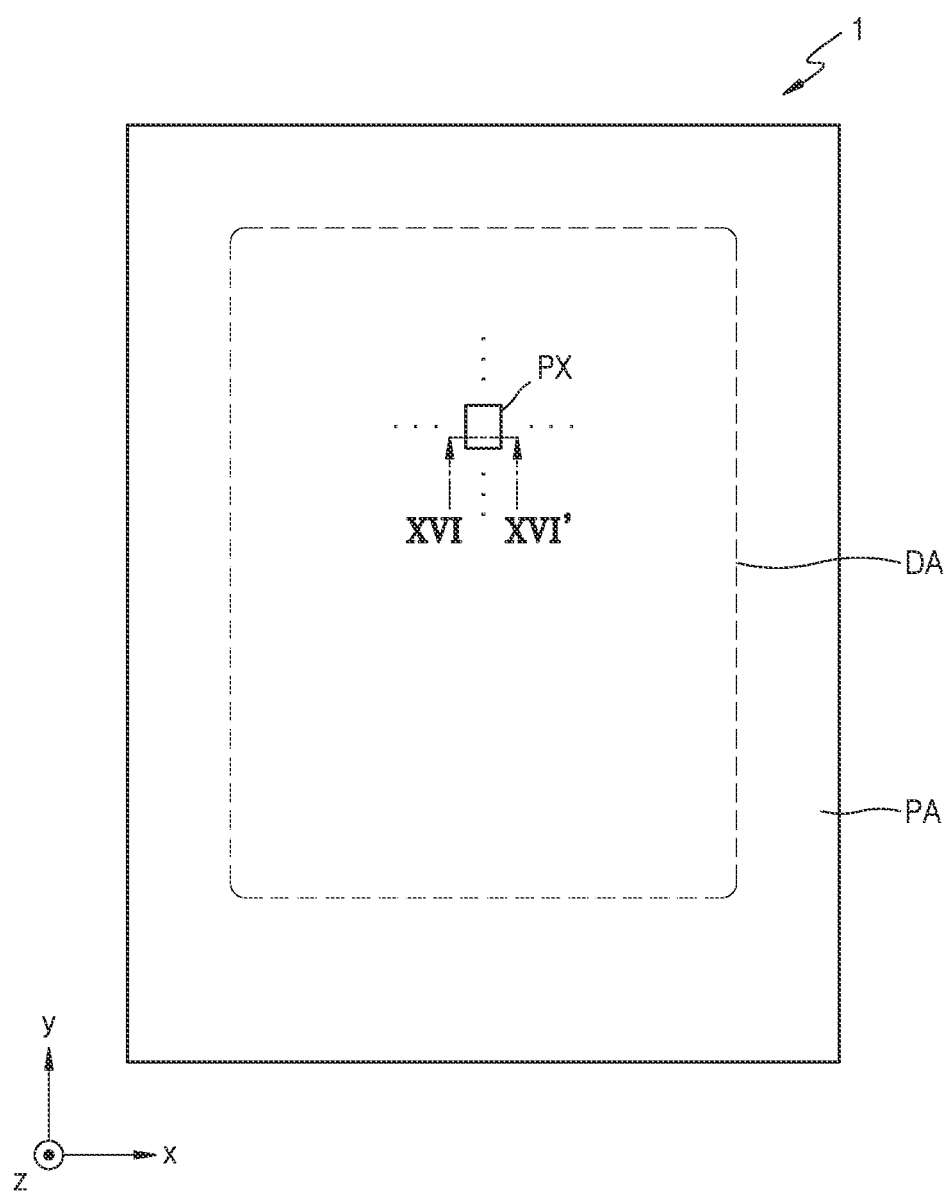
FIG. 15 is a schematic plan view of a display apparatus manufactured by the apparatus for manufacturing a display apparatus according to an embodiment.

FIG. 15 is a schematic plan view of a display apparatus manufactured by an apparatus for manufacturing a display apparatus according to an embodiment.

Referring to FIG. 15, the display apparatus 1 manufactured according to an embodiment may include a display area DA, and a peripheral area PA disposed outside the display area DA. The display apparatus 1 may provide an image through an array of a plurality of pixels PX, which may be two-dimensionally arranged at (e.g., in or on) the display area DA.

The peripheral area PA is an area that does not provide an image, and may entirely or partially surround (e.g., around a periphery of) the display area DA. Drivers and the like for providing electrical signals or power to a pixel circuit corresponding to each of the pixels PX may be disposed at (e.g., in or on) the peripheral area PA. A pad, which is an area to which electronic devices, printed circuit boards, and the like may be electrically connected, may be disposed at (e.g., in or on) the peripheral area PA.

Although the display apparatus 1 is described in the context of including an organic light-emitting diode (OLED) as a light-emitting element hereinafter, the present disclosure is not limited thereto. In another embodiment, the display apparatus 1 may include a light-emitting display apparatus including an inorganic light-emitting diode, or in other words, an inorganic light-emitting display. The inorganic light-emitting diode may include a PN diode including suitable materials based on an inorganic material semiconductor. When a voltage is applied to a PN junction diode in a forward direction, holes and electrons are injected, and energy generated due to recombination of the holes and the electrons is converted to light energy, so that light of a desired color (e.g., a predetermined or certain color) may be emitted. The inorganic light-emitting diode described above may have a width of tens to hundreds of micrometers, and in some embodiments, the inorganic light-emitting diode may be referred to as a micro LED. In another embodiment, the display apparatus 1 may include a quantum-dot light-emitting display.

The display apparatus 1 may be used as a display screen of various suitable products, for example, such as for portable electronic apparatuses, such as mobile phones, smartphones, tablet personal computers (PCs), mobile communication terminals, electronic organizers, electronic books, portable multimedia players (PMPs), navigation devices, ultra-mobile PCs (UMPCs), and the like, as well as for televisions, notebook computers, monitors, billboards, Internet of things (IoT) devices, and the like. Furthermore, the display apparatus 1 according to an embodiment may be used in various suitable wearable devices, such as smart watches, watch phones, glasses-type displays, head mounted displays (HMDs), and the like. Furthermore, the display apparatus 1 according to an embodiment may be used as a display for an instrument panel for vehicles, a center information display (CID) arranged on the center fascia or dashboard of vehicles, a room mirror display in lieu of a side mirror of vehicles, and/or a display arranged at the rear side of a front seat as an entertainment for a rear seat of vehicles.

Figure 16:
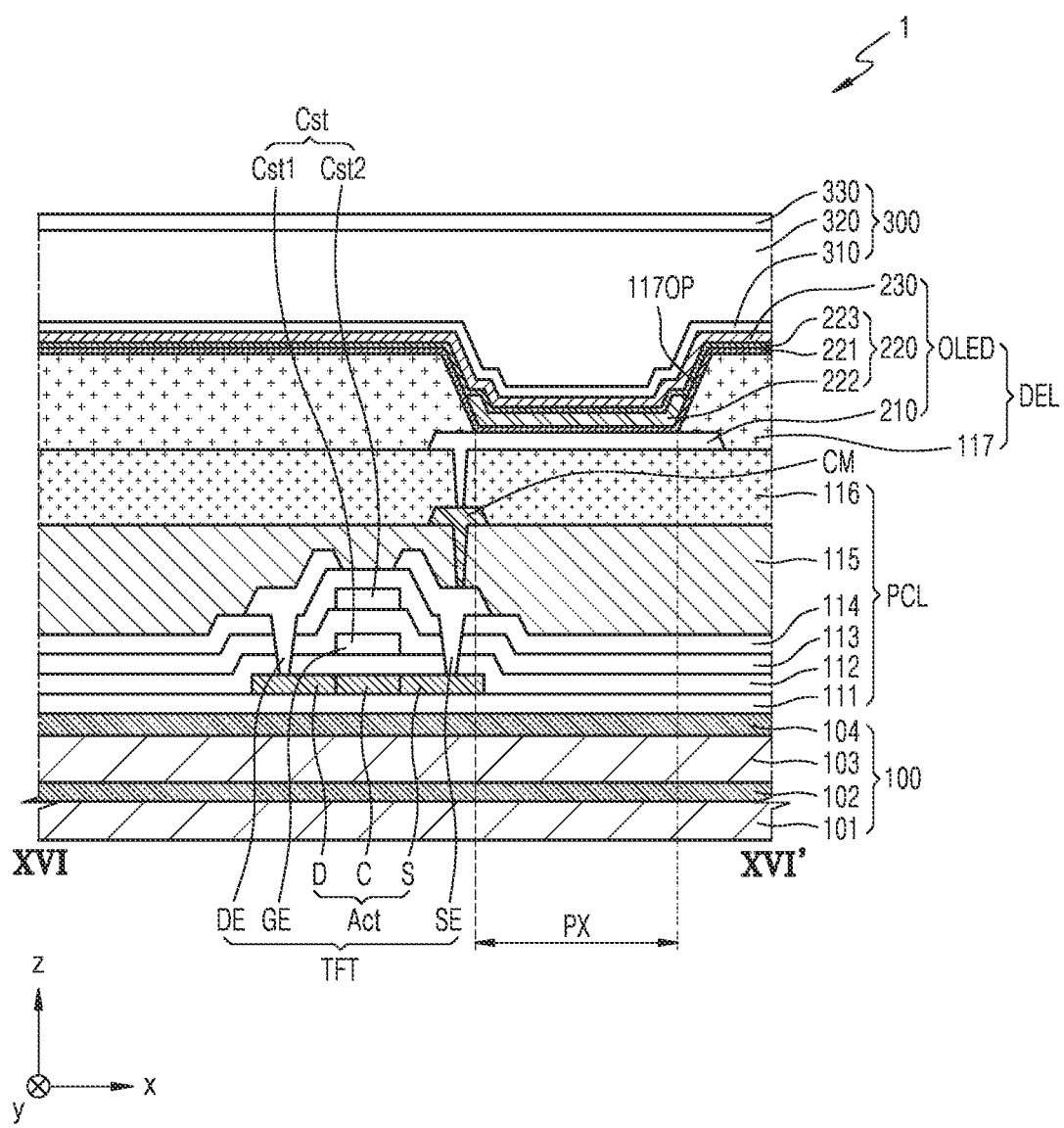
FIG. 16 is a schematic cross-sectional view of a display apparatus manufactured by the apparatus for manufacturing a display apparatus according to an embodiment.

FIG. 16 is a schematic cross-sectional view of a display apparatus manufactured by using an apparatus for manufacturing a display apparatus according to an embodiment. For example, FIG. 16 may correspond to a cross-sectional view of the display apparatus 1 taken along the line XVI-XVI' of FIG. 15.

Referring to FIG. 16, the display apparatus 1 may include a stacked structure of the substrate 100, a pixel circuit layer PCL, a display element layer DEL, and an encapsulation layer 300. The display substrate DS of FIG. 1 may be obtained by stacking at least one of the pixel circuit layer PCL, the display element layer DEL, or the encapsulation layer 300 on, for example, the substrate 100 in a process of manufacturing the display apparatus 1.

The substrate 100 may having a multilayered structure including a base layer including a polymer resin, and an inorganic layer. For example, the substrate 100 may include a base layer including a polymer resin, and a barrier layer that is an inorganic insulating layer. For example, the substrate 100 may include a first base layer 101, a first barrier layer 102, a second base layer 103, and a second barrier layer 104, which are sequentially stacked. The first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (TAC), cellulose acetate propionate (CAP), and/or the like. The first barrier layer 102 and the second barrier layer 104 may include an inorganic insulating material, such as a silicon oxide, a silicon oxynitride, and/or a silicon nitride. The substrate 100 may have flexibility.

The pixel circuit layer PCL is disposed on the substrate 100. FIG. 16 illustrates that the pixel circuit layer PCL includes a thin film transistor TFT, and a buffer layer 111, a first gate insulating layer 112, a second gate insulating layer 113, an interlayer insulating layer 114, a first planarization insulating layer 115, and a second planarization insulating layer 116, which are disposed below and/or above constituent elements of the thin film transistor TFT.

The buffer layer 111 may reduce or block infiltration of foreign materials, such as moisture and/or external air, from under (e.g., underneath) the substrate 100, and may provide a planarized or substantially planarized surface on the substrate 100. The buffer layer 111 may include an inorganic insulating material, such as a silicon oxide, a silicon oxynitride, and/or a silicon nitride, and may have a single layer structure or a multilayered structure including one or more of the above-described materials.

The thin film transistor TFT may be disposed on the buffer layer 111, and may include a semiconductor layer Act. The semiconductor layer Act may include polysilicon. As another example, the semiconductor layer Act may include amorphous silicon, an oxide semiconductor, an organic semiconductor, or the like. The semiconductor layer Act may include a channel region C, and a drain region D and a source region S disposed at opposite sides of the channel region C. A gate electrode GE may overlap with the channel region C.

The gate electrode GE may include a low-resistance metal material. The gate electrode GE may include a conductive material including molybdenum (Mo), aluminum (Al), copper (Cu), titanium (Ti), and/or the like, and may be a multilayered structure or a single layer structure including one or more of the above materials.

The first gate insulating layer 112 may be between the semiconductor layer Act and the gate electrode GE, and may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. ZnO may include oxide zinc (ZnO) and/or peroxide zinc ($ZnO_2$).

The second gate insulating layer 113 may cover the gate electrode GE. The second gate insulating layer 113, similar to the first gate insulating layer 112, may include an inorganic insulating material, such as $SiO_2$, $SiN_x$, SiON, $Al_2O_3$, $TiO_2$, $Ta_2O_5$, $HfO_2$, or $ZnO_x$. ZnO may include ZnO and/or $ZnO_2$.

An upper electrode Cst2 of a storage capacitor Cst may be disposed on the second gate insulating layer 113. The upper electrode Cst2 may overlap with the gate electrode GE thereunder. The gate electrode GE and the upper electrode Cst2 overlapping with each other with the second gate insulating layer 113 therebetween may form the storage capacitor Cst. In other words, the gate electrode GE may function as a lower electrode Cst1 of the storage capacitor Cst.

As such, the storage capacitor Cst and the thin film transistor TFT may overlap with each other. In some embodiments, the storage capacitor Cst may not overlap with the thin film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer structure or a multilayered structure including one or more of the above-described materials.

The interlayer insulating layer 114 may cover the upper electrode Cst2. The interlayer insulating layer 114 may include $SiO_2$, $SiN_x$, SiON, $Al_2O_3$, $TiO_2$, $Ta_2O_5$, $HfO_2$, or $ZnO_x$, and/or the like. ZnO, may include ZnO and/or $ZnO_2$. The interlayer insulating layer 114 may be a single layer structure or a multilayered structure including one or more of the above-described inorganic insulating materials.

A drain electrode DE and a source electrode SE may each be disposed on the interlayer insulating layer 114. The drain electrode DE and the source electrode SE may be connected to the drain region D and the source region S, respectively, through contact holes formed in (e.g., penetrating) the insulating layers thereunder. The drain electrode DE and the source electrode SE may include a material exhibiting excellent conductivity. The drain electrode DE and the source electrode SE may include a conductive material including Mo, Al, Cu, Ti, and/or the like, and may be a multilayered structure or a single layer structure including one or more of the above materials. In an embodiment, the drain electrode DE and the source electrode SE may each have a multilayered structure of Ti/Al/Ti.

The first planarization insulating layer 115 may cover the drain electrode DE and the source electrode SE. The first planarization insulating layer 115 may include an organic insulating material, such as a general purpose polymer, such as polymethylmethacrylate (PMMA) or polystyrene (PS), polymer derivatives having a phenolic group, acrylic polymers, imide-based polymers, aryl ether-based polymers, amide-based polymers, fluorine-based polymers, p-xylene-based polymers, vinyl alcohol-based polymers, and/or suitable blends thereof.

The second planarization insulating layer 116 may be disposed on the first planarization insulating layer 115. The second planarization insulating layer 116 may include the same material as that of the first planarization insulating layer 115, and may include an organic insulating material, such as a general purpose polymer, such as PMMA or PS, polymer derivatives having a phenolic group, acrylic polymers, imide-based polymers, aryl ether-based polymers, amide-based polymers, fluorine-based polymers, p-xylene-based polymers, vinyl alcohol-based polymers, and/or suitable blends thereof.

The display element layer DEL may be disposed on the pixel circuit layer PCL having the above-described structure. The display element layer DEL may include an organic light-emitting diode OLED as a display element, or in other words, a light-emitting element, and the organic light-emitting diode OLED may include a stacked structure of a pixel electrode 210, an intermediate layer 220, and a common electrode 230. The organic light-emitting diode OLED may emit, for example, such as red, green, or blue light, or red, green, blue, or white light. The organic light-emitting diode OLED may emit light through a light-emitting area, and the light-emitting area may be defined to be a pixel PX.

The pixel electrode 210 of the organic light-emitting diode OLED may be electrically connected to the thin film transistor TFT through contact holes formed in (e.g., penetrating) the second planarization insulating layer 116 and the first planarization insulating layer 115, and a contact metal CM disposed on the first planarization insulating layer 115.

The pixel electrode 210 may include a conductive oxide, such as an indium tin oxide (ITO), an indium zinc oxide (IZO), ZnO, an indium oxide ($In_2O_3$), an indium gallium oxide (IGO), or an aluminum zinc oxide (AZO). In another embodiment, the pixel electrode 210 may include a reflective film including Ag, Mg, Al, Pt, Pd, Au, Ni, Nd, Ir, Cr, or a suitable compound thereof. In another embodiment, the pixel electrode 210 may further include a layer including ITO, IZO, ZnO, or $In_2O_3$ above/below the above-described reflective film.

A pixel defining layer 117 having an opening 117OP that exposes a center portion of the pixel electrode 210 is disposed on the pixel electrode 210. The pixel defining layer 117 may include an organic insulating material and/or an inorganic insulating material. The opening 117OP may define the light-emitting area where light from the organic light-emitting diode OLED is emitted. For example, the size/width of the opening 117OP may correspond to the size/width of the light-emitting area. Accordingly, the size and/or width of the pixel PX may depend on the size and/or width of the opening 117OP of the pixel defining layer 117 corresponding to the pixel PX.

The intermediate layer 220 may include an emission layer 222 formed to correspond to the pixel electrode 210. The emission layer 222 may include a polymer or a low molecular weight organic material that emits light of a desired color (e.g., a predetermined or certain color). As another example, the emission layer 222 may include an inorganic light-emitting material or quantum dots.

In an embodiment, the intermediate layer 220 may include a first functional layer 221 and a second functional layer 223, which are disposed below and above, respectively, the emission layer 222. The first functional layer 221 may include, for example, a hole transport layer (HTL), or a HTL and a hole injection layer (HIL). The second functional layer 223 that is disposed above the emission layer 222 may include an electron transport layer (ETL) and/or an electron injection layer (EIL). The first functional layer 221 and/or the second functional layer 223, like the common electrode 230 described in more detail below, may be a common layer that entirely covers the substrate 100.

The common electrode 230 is disposed on the pixel electrode 210, and may overlap with the pixel electrode 210. The common electrode 230 may include a conductive material having a low work function. For example, the common electrode 230 may include a (semi-)transparent layer including Ag, Mg, Al, Pt, Pd, Au, Ni, Nd, Ir, Cr, lithium (Li), Ca, or the like, or a suitable alloy thereof. As another example, the common electrode 230 may further include a layer including ITO, IZO, ZnO, or $In_2O_3$ on the (semi-)transparent layer including the one or more of the above-described materials. The common electrode 230 may be integrally formed to entirely cover the substrate 100.

The encapsulation layer 300 may be disposed on the display element layer DEL, and may cover the display element layer DEL. The encapsulation layer 300 includes at least one an inorganic encapsulation layer, and at least one organic encapsulation layer. In an embodiment, FIG. 16 illustrates that the encapsulation layer 300 includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may each include one or more inorganic materials from among an aluminum oxide, a titanium oxide, a tantalum oxide, a hafnium oxide, a zinc oxide, a silicon oxide, a silicon nitride, or a silicon oxynitride. The organic encapsulation layer 320 may include a polymer-based material. The polymer-based material may include acrylic resin, epoxy-based resin, polyimide, polyethylene, and/or the like. In an embodiment, the organic encapsulation layer 320 may include acrylate. The organic encapsulation layer 320 may be formed by curing a monomer or applying a polymer. The organic encapsulation layer 320 may have transparency.

In some embodiments, a touch sensor layer may be disposed on the encapsulation layer 300, and an optical functional layer may be disposed on touch sensor layer. The touch sensor layer may obtain coordinates information according to an external input, for example, such as a touch event. The optical functional layer may reduce reflectivity of light (e.g., external light) incident on the display apparatus from the outside, and/or may improve the color purity of light emitted from the display apparatus. In an embodiment, the optical functional layer may include a retarder and/or a polarizer. The retarder may be of a film type or a liquid crystal coating type, and may include a $\lambda/2$ retarder and/or a $\lambda/4$ retarder. The polarizer may also be of a film type or a liquid crystal coating type. The film type may include a stretchable synthetic resin film, and a liquid crystal coating type may include liquid crystals arranged in a suitable array (e.g., a predetermined or certain array). The retarder and the polarizer may further include a protective film.

An adhesive member may be disposed between the touch electrode layer and the optical functional layer. The adhesive member may employ any suitable general member, without any particular limitation, as would be known to those having ordinary skill in the art. For example, the adhesive member may be a pressure sensitive adhesive (PSA).

According to one or more embodiments of the present disclosure, when a mask sheet and/or a mask frame are deformed by adjusting the length of a side of the mask frame, deposition quality may be improved.

According to one or more embodiments of the present disclosure, the length of the side of the mask frame may be adjusted without removing a mask sheet welded to the mask frame, and thus, work efficiency may be improved, and loss of a raw material may be prevented or reduced.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A mask assembly comprising:
   a mask frame having a plurality of sides including a first side extending in a first direction, and an opening area defined by the plurality of sides;
   a gap portion recessed in the first side in a second direction crossing the first direction in a plan view;
   a mask sheet covering the opening area; and
   a gap adjustment portion tensile-welded to the mask frame across the gap portion.

2. The mask assembly of claim 1, wherein the gap portion comprises:
   a first portion recessed in the second direction in a plan view; and
   a second portion at one end portion of the first portion, and recessed in the second direction, a width of at least part of the second portion being greater than a width of the first portion.

3. The mask assembly of claim 2, wherein the second portion has a circular shape in a plan view.

4. The mask assembly of claim 2, wherein the width of the first portion in the first direction is less than a length of the first portion in the second direction.

5. The mask assembly of claim 2, wherein the width of the first portion in the first direction gradually decreases along the second direction.

6. The mask assembly of claim 1, wherein the mask sheet comprises a first mask sheet and a second mask sheet parallel to each other in the first direction, and
   the gap portion is spaced from the first mask sheet and the second mask sheet in the second direction, and located between the first mask sheet and the second mask sheet in the first direction.

7. A mask assembly comprising:
   a mask frame having a plurality of sides including a first side extending in a first direction, and an opening area defined by the plurality of sides;
   a gap portion recessed in the first side in a second direction crossing the first direction;
   a mask sheet covering the opening area; and
   a gap adjustment portion tensile-welded to the mask frame across the gap portion, wherein the mask sheet comprises a first mask sheet and a second mask sheet parallel to each other in the first direction, and the gap portion is spaced from the first mask sheet and the second mask sheet in the second direction, and overlaps with each of a width of the first mask sheet extending in the first direction and a width of the second mask sheet extending in the first direction in the second direction.

* * * * *